US012763548B2

(12) United States Patent
Noda et al.

(10) Patent No.: US 12,763,548 B2
(45) Date of Patent: Oct. 13, 2026

(54) TWO-DIMENSIONAL PHOTONIC CRYSTAL LASER

(71) Applicant: KYOTO UNIVERSITY, Kyoto (JP)

(72) Inventors: Susumu Noda, Kyoto (JP); Menaka De Zoysa, Muko (JP); Ryoichi Sakata, Kyoto (JP); Kenji Ishizaki, Kyoto (JP); Takuya Inoue, Osaka (JP); Masahiro Yoshida, Kyoto (JP)

(73) Assignee: KYOTO UNIVERSITY, Kyoto (JP)

( * ) Notice: Subject to any disclaimer, the term of this patent is extended or adjusted under 35 U.S.C. 154(b) by 593 days.

(21) Appl. No.: 18/275,963

(22) PCT Filed: Feb. 24, 2022

(86) PCT No.: PCT/JP2022/007740

§ 371 (c)(1),
(2) Date: Aug. 4, 2023

(87) PCT Pub. No.: WO2022/181723

PCT Pub. Date: Sep. 1, 2022

(65) Prior Publication Data

US 2024/0128717 A1 Apr. 18, 2024

(30) Foreign Application Priority Data

Feb. 25, 2021 (JP) ................................ 2021-028588
Sep. 10, 2021 (JP) ................................ 2021-147897

(51) Int. Cl.

*H01S 5/11* (2021.01)
*H01S 5/042* (2006.01)
*H01S 5/185* (2021.01)

(52) U.S. Cl.

CPC ........... *H01S 5/11* (2021.01); *H01S 5/04256* (2019.08); *H01S 5/185* (2021.01)

(58) Field of Classification Search

CPC ........................................................ H01S 5/11
See application file for complete search history.

(56) References Cited

U.S. PATENT DOCUMENTS

2013/0039375 A1* 2/2013 Noda ................. H01S 5/04256 372/44.01
2016/0020580 A1* 1/2016 Takiguchi .............. H01S 5/187 372/44.011

(Continued)

FOREIGN PATENT DOCUMENTS

CN 105143923 A * 12/2015 ............ H10F 77/42
JP 2019-106398 A 6/2019

(Continued)

OTHER PUBLICATIONS

Dec. 3, 2024 Extended European Search Report issued in European Patent Application No. 22759758.0.

(Continued)

*Primary Examiner* — James A Menefee
(74) *Attorney, Agent, or Firm* — Oliff PLC

(57) ABSTRACT

A two-dimensional photonic crystal laser includes: electrodes; an active layer; and a two-dimensional photonic crystal layer in which modified refractive index regions are disposed to be shifted by different shift amounts from respective lattice points or/and are disposed at the respective lattice points with different areas, the shift amount or/and the area is/are modified with a composite modulation period and expressed by a modulation phase $\Psi(r\uparrow)$ expressed using a vector $r\uparrow$ indicating a position of each lattice point of the two-dimensional lattice, a vector $k_n\uparrow$ indicating a combination of an inclination angle and an azimuthal angle of each of n laser beams mutually differing in the inclination angle and/or the azimuthal angle, and an amplitude $A_n$ and a phase $\exp(i\alpha_n)$ determined for each n and the amplitude $A_n$ and/or (Continued)

the phase $\exp(i\alpha_n)$ for each value of n differ(s) from each other in at least two different values of n.

12 Claims, 20 Drawing Sheets

(56) References Cited

U.S. PATENT DOCUMENTS

| | | | | |
|---|---|---|---|---|
| 2016/0248224 | A1 | 8/2016 | Noda et al. | |
| 2016/0261093 | A1 | 9/2016 | Noda et al. | |
| 2019/0288483 | A1 | 9/2019 | Sugiyama et al. | |
| 2020/0028322 | A1* | 1/2020 | Noda | H01S 5/0267 |
| 2020/0373739 | A1* | 11/2020 | Hirose | H01S 5/222 |
| 2021/0226412 | A1 | 7/2021 | Hirose et al. | |
| 2021/0249842 | A1* | 8/2021 | Hirose | H01S 5/185 |
| 2022/0128696 | A1* | 4/2022 | Noda | G01S 17/42 |
| 2022/0171058 | A1 | 6/2022 | Mitomi | |

FOREIGN PATENT DOCUMENTS

| | | | | |
|---|---|---|---|---|
| JP | 2020-148512 | A | 9/2020 | |
| WO | 2014/136607 | A1 | 9/2014 | |
| WO | 2018/181202 | A1 | 10/2018 | |
| WO | 2020/045453 | A1 | 3/2020 | |
| WO | WO-2021006338 | A1 * | 1/2021 | G01S 17/89 |

OTHER PUBLICATIONS

Sakata et al., "Dually modulated photonic crystals enabling high-power high-beam-quality two-dimensional beam scanning lasers", Nature Communications, vol. 11, No. 1, (2020), https://doi.org/10.1038/s41467-020-17092-w, 10 pages.

Noda et al., "Photonic-Crystal Surface-Emitting Lasers: Review and Introduction of Modulated-Photonic Crystals," EEE Journal of Selected Topics in Quantum Electronics, Nov./Dec. 2017, vol. 23, No. 6, 4900107.

May 17, 2022 Written Opinion of the International Searching Authority issued in International Patent Application No. PCT/JP2022/007740.

* cited by examiner

WITH SECOND MODIFIED REFRACTIVE INDEX REGION (AREA $0.03a^2$)

WITHOUT SECOND MODIFIED REFRACTIVE INDEX REGION (COMPARATIVE EXAMPLE)

FIRST COLLECTIVE ELECTRODE

SECOND COLLECTIVE ELECTRODE

TWO-DIMENSIONAL PHOTONIC CRYSTAL LASER

TECHNICAL FIELD

The present invention relates to a two-dimensional photonic crystal laser (also referred to as "two-dimensional photonic crystal surface emitting laser") in which a two-dimensional photonic crystal is used for amplifying light.

BACKGROUND ART

A two-dimensional photonic crystal laser includes an active layer, a two-dimensional photonic crystal layer, and a pair of electrodes (electrode pair) provided so as to sandwich the active layer and the two-dimensional photonic crystal layer. The active layer generates light emission within a specific emission wavelength band upon being supplied with carriers (carrier holes, electrons) from the electrode pair. The two-dimensional photonic crystal layer has a configuration including a plate-shaped base member in which modified refractive index regions whose refractive index differs from that of the base member are periodically disposed two-dimensionally. The modified refractive index regions include air holes (air) formed in the base member, or a member different from the material of the base member.

In such a two-dimensional photonic crystal laser, only light having a predetermined wavelength corresponding to the period length of the disposition of the modified refractive index regions among light generated in the active layer is amplified in the two-dimensional photonic crystal layer and laser oscillates, and a laser beam is emitted from a surface of the two-dimensional photonic crystal layer.

In the two-dimensional photonic crystal laser, typically, the modified refractive index regions having the same planar shape are disposed at lattice points of a two-dimensional lattice such as a square lattice, a rectangular lattice, or a triangular lattice. In such a typical two-dimensional photonic crystal laser, the laser beam is emitted in a direction perpendicular to the two-dimensional photonic crystal layer.

On the other hand, in a two-dimensional photonic crystal laser described in Patent Literatures 1 and 2, at a corresponding one of lattice points of the two-dimensional lattice, each of the plurality of modified refractive index regions is disposed to be shifted from the lattice point by a different shift amount each, or/and each of the plurality of modified refractive index regions is disposed with a different area. Here, the shift amount is a vector amount (that is, an amount having a magnitude and a direction) in a face parallel to the two-dimensional photonic crystal layer. The "different shift amount" also includes a case where the magnitude of shift is the same and only the direction of shift is different. The shift amount or/and the area change(s) with a predetermined period (longer than a period of disposition of the lattice points) along a predetermined direction parallel to the two-dimensional photonic crystal layer. The period of the change in the shift amount or/and the area is referred to as "modulation period". The shift amount or/and the area in each of the modified refractive index regions modulated with this modulation period is/are referred to as "modulation phase". The two-dimensional photonic crystal laser including the two-dimensional photonic crystal layer in which the modified refractive index regions are disposed with the shift amounts or/and the areas thus modulated emits two laser beams having an angle (inclination angle) inclined from the direction perpendicular to the two-dimensional photonic crystal layer by an angle according to the modulation period and having azimuthal angles different from each other by 180° in the predetermined direction.

CITATION LIST

Patent Literature

Patent Literature 1: WO 2014/136607 A

Patent Literature 2: US 2016/0248224 A

Patent Literature 3: JP 2020-148512 A

Non Patent Literature

Non Patent Literature 1: Susumu Noda and four others, "Photonic-Crystal Surface-Emitting Lasers: Review and Introduction of Modulated-Photonic Crystal", (USA), published by the Institute of Electrical and Electronics Engineers, IEEE Journal of Selected Topics in Quantum Electronics, vol. 23 (2017) 4900107

SUMMARY OF INVENTION

Technical Problem

As described above, the two-dimensional photonic crystal laser described in Patent Literatures 1 and 2 emits two laser beams having the same inclination angle and the azimuthal angles different from each other by 180°. However, in the field of, for example, laser imaging detection and ranging (LIDAR), which is a sensor used for remote sensing, a demand exists for a laser light source that emits more than two laser beams.

An object of the present invention is to provide a two-dimensional photonic crystal laser that emits more than two laser beams.

Solution to Problem

A two-dimensional photonic crystal laser according to the present invention aimed at solving the aforementioned problems includes:

a) a pair of electrodes;

b) an active layer provided between the pair of electrodes and configured to generate light of a predetermined wavelength upon being supplied with an electric current from the electrodes; and c) a two-dimensional photonic crystal layer provided between one of the pair of electrodes and the active layer and including a plate-shaped base member and a plurality of modified refractive index regions disposed in the base member and having a refractive index different from a refractive index of the base member, in which the plurality of modified refractive index regions are disposed to be shifted by different shift amounts from respective lattice points of a two-dimensional lattice which are periodically disposed in the base member with a period corresponding to the predetermined wavelength, or/and are disposed at the respective lattice points with different areas, the shift amount or/and the area of each of the plurality of modified refractive index regions is/are modified with a composite modulation period in which a plurality of periods different from each other are superposed on each other, and is/are expressed by a modulation phase $\Psi(r\uparrow)$ expressed using a vector $r\uparrow$ indicating a position of each of the lattice points of the two-dimensional lattice, a vector $k_n\uparrow$ indicating a combination of an inclination angle and an azimuthal angle of each of n (n is an integer of 2 or more) laser beams differing in the inclination angle and/or the azimuthal angle from each other, and an amplitude $A_n$ and a phase $\exp(i\alpha_n)$ determined for each n as

[Expression 1]

$$\Psi(r\uparrow) = \arg\left[\int\int\sum_n A_n\exp(i\alpha_n)\delta(k\uparrow - k_n\uparrow)\exp(ik\uparrow\cdot r\uparrow)dk\uparrow\right], \tag{1}$$

and the amplitude $A_n$ and/or the phase $\exp(i\alpha_n)$ for each value of n differ(s) from each other in at least two different values of n.

The "composite modulation period in which a plurality of periods different from each other are superposed on each other" may be a period in which modulations formed with a plurality of different period lengths along one direction (the same direction) parallel to the two-dimensional photonic crystal layer are superposed on each other, a period in which modulations formed with one period length along each of a plurality of directions parallel to the two-dimensional photonic crystal layer and different from each other (the period length may be the same length or different lengths in the respective directions) are superposed on each other, and a combination of the periods (a period in which modulations formed with a plurality of period lengths different from each other along the plurality of directions are superposed on each other).

Similarly to the above description, the "shift amount" is a vector amount (an amount having a magnitude and a direction) in a face parallel to the two-dimensional photonic crystal layer, and the "different shift amount" also includes a case where the magnitude of shift is the same and only the direction of shift is different.

In the two-dimensional photonic crystal laser according to the present invention, the wavelength of the output laser beam is determined by a lattice point period in the two-dimensional photonic crystal layer (as a premise, light of a predetermined wavelength corresponding to the lattice point period is generated in the active layer), whereas the inclination angle and the azimuthal angle of the laser beam are determined by the composite modulation period in the modulation phase $\Psi(r\uparrow)$ (the shift amount or/and the area). The modulation phase $\Psi(r\uparrow)$ ($r\uparrow$ is the vector indicating the position of the lattice point) modulated with the composite modulation period is expressed using vectors $k\uparrow$ and $k_n\uparrow$ described later as

[Expression 2]

$$\Psi(r\uparrow) = \arg\left[\int\int\sum_n c_n\delta(k\uparrow - k_n\uparrow)\exp(ik\uparrow\cdot r\uparrow)dk\uparrow\right]. \tag{2}$$

Here, "arg" is the argument of a complex number. $c_n$ is expressed as

[Expression 3]

$$c_n = A_n\exp(i\alpha_n). \tag{3}$$

$A_n$ and $\alpha_n$ will be described later. When Expression (3) is substituted into Expression (2), Expression (1) is obtained. $\delta$ is the $\delta$ function ($\delta(x)=1$ at $x=0$, and $\delta(x)=0$ at $x\neq 0$). $k\uparrow$ is a vector expressed using an inclination angle $\theta$ and an azimuthal angle $\varphi$ of the laser beam to be emitted and an effective refractive index (refractive index sensed by light in the two-dimensional photonic crystal layer) $n_{eff}$ of the two-dimensional photonic crystal layer. For example, in a case where the two-dimensional lattice is a square lattice having a period length a, $k\uparrow$ is expressed as

[Expression 4]

$$k\uparrow = \left(\left(\frac{1}{2} - \frac{1}{\sqrt{2}n_{eff}}\sin\theta\cos\phi\right)\frac{2\pi}{a}, \left(\frac{1}{2} - \frac{1}{\sqrt{2}n_{eff}}\sin\theta\sin\phi\right)\frac{2\pi}{a}\right), \tag{4}$$

(see Non Patent Literature 1; however, in Non Patent Literature 1, angles $\theta_x$ and $\theta_y$ defined by $\sin\theta_x=\sin\theta\cos\theta$ and $\sin\theta_y=\sin\theta\sin\varphi$ are used). $k_n\Psi$ (n=1, 2, 3, . . . ) indicate vectors $k\uparrow$ having different magnitudes and/or directions according to n. A different inclination angle $\theta$ and/or azimuthal angle $\varphi$ correspond(s) to each value of n. From Expressions (2) to (4), $\Psi(r\uparrow)$ corresponds to an argument taking the sum of a term $a_n$

[Expression 5]

$$a_n = \int\int c_n\exp(ik_n\uparrow\cdot r\uparrow)dk_n\uparrow, \tag{5}$$

obtained for each value of n, that is, for each combination ($\theta$, $\varphi$) of the inclination angle $\theta$ and the azimuthal angle $\varphi$ of the laser beam to be emitted. Each term $a_n$ has a period corresponding to the magnitude of $k_n\uparrow$. In addition, weighting defined by $c_n$ is added to each term $a_n$. The weighting coefficient $c_n$ includes $A_n$ and $\alpha_n$ defined in Expression (3), in which $A_n$ corresponds to an amplitude and an corresponds to a phase. The "phase" mentioned here does not refer to the modulation phase $\Psi(r\uparrow)$ itself, but refers to a phase of the weighting coefficient $c_n$ that defines the modulation phase $\Psi(r\uparrow)$. Therefore, the modulation phase $\Psi(r\uparrow)$ of Expression (1) is defined by the modulation period (composite modulation period) in which the periods each determined for each combination ($\theta$, $\varphi$) (for each $k_n\Psi$) of the inclination angle $\theta$ and the azimuthal angle $\varphi$ of the laser beam to be emitted are superposed on each other with the weighting added to each period.

Since the modified refractive index regions are disposed with the modulation phase $\Psi(r\uparrow)$ modulated with such a composite modulation period, the two-dimensional photonic crystal laser according to the present invention emits, for each $k_n\uparrow$, one laser beam having one set of the inclination angle and the azimuthal angle corresponding to each $k_n\uparrow$ and another laser beam differing only in the azimuthal angle from that of the one laser beam by 180°. However, in a case where the inclination angle of the one laser beam is 0°, the other laser beam is not emitted. Therefore, in the two-dimensional photonic crystal laser according to the present invention, 2n or (2n−1) (in a case of including one laser beam with an inclination angle of 0°) laser beams having different inclination angles and/or azimuthal angles are obtained.

The amplitude $A_n$ and/or the phase $\exp(i\alpha_n)$ for each value of n are/is made different from each other in at least two different values of n. In other words, the intensity of each laser beam can be adjusted by adding different weighting to each inclination angle and azimuthal angle of the emitted laser beam (at least between two sets having different combinations of the inclination angle and the azimuthal angle).

In the present invention, it is more preferable that the phase $\exp(i\alpha_n)$ is set randomly (without having any rule) for each value of n. As a result, it is possible to inhibit occurrence of interference between the laser beams and to make the intensities of the laser beams close to a uniform intensity.

It is more preferable that the phase $\exp(i\alpha_n)$ is randomly set for each value of n as described above, and the amplitude $A_n$ is further set to a different value for each term having a different value of n. As a result, it is possible to further adjust the intensities of the laser beams to make the intensities of the laser beams closer to a uniform intensity.

The value of the amplitude $A_n$ for each term having a different value of n can be determined by, for example, the following method. First, the shift amount or/and the area of each modified refractive index region is/are obtained from the modulation phase $\Psi(r\uparrow)$ obtained by Expression (1) when the phase $\exp(i\alpha_n)$ is randomly set for each value of n and the amplitude $A_n$ is set to a predetermined value (for example, 1) regardless of the value of n. A state modulated by the shift amount or/and the area of each modified refractive index region obtained here is referred to as "basic modulation state". From the two-dimensional photonic crystal layer in the basic modulation state, a distribution of an electric field (referred to as "radiated electric field distribution") radiated from each position (at each position) in the two-dimensional photonic crystal layer is obtained by applying a method used in designing a conventional two-dimensional photonic crystal laser. Furthermore, by performing a Fourier transform on the radiated electric field distribution, a distribution of an electric field (referred to as "far electric field distribution") at a position separated from the two-dimensional photonic crystal layer (for example, a position where an object is irradiated with the laser beam) is obtained as a function having the vector $k\uparrow$ as a variable. Contrary to the case of obtaining the far electric field distribution, the radiated electric field distribution can be obtained by performing an inverse Fourier transform on the far electric field distribution. The calculation in [ ] of Expression (1) corresponds to obtaining the radiated electric field distribution (indicated by a complex number) by performing the inverse Fourier transform on a far electric field distribution $\Sigma_n a_n \exp(i\alpha_n)\delta(k\uparrow - k_n\uparrow)$ (indicated by a complex number).

In the far electric field distribution by the plurality of laser beams radiated from the two-dimensional photonic crystal laser including the two-dimensional photonic crystal layer in the basic modulation state obtained as described above, there usually occurs a difference in intensity for each laser beam (according to the vector $k_n\uparrow$ for each laser beam applied to the vector $k\uparrow$ as the variable of the far electric field distribution). Hence, on the basis of the obtained far electric field distribution, a new modulation phase $\Psi(r\uparrow)$ is obtained by Expression (1), in which the value of the amplitude $A_n$ corresponding to the laser beam determined to have an intensity weaker than those of the other laser beams (having the same value of n as "n" in the vector $k_n\uparrow$ of the laser beam) is increased to be larger than the predetermined value in the basic modulation state, and the value of the amplitude $A_n$ corresponding to the laser beam determined to have an intensity stronger than those of the other laser beams is decreased to be smaller than the predetermined value. The shift amount or/and the area (new modulation state) of each modified refractive index region is/are obtained from the new modulation phase $\Psi(r\uparrow)$. From the new modulation state, the radiated electric field distribution is obtained, and the far electric field distribution is further obtained. In the far electric field distribution obtained from the new modulation state as described above, unless the increase/decrease of the amplitude $A_n$ from the basic modulation state is excessive, the difference in intensity for each laser beam is smaller than that in the case of the basic modulation state (when this difference is conversely larger, the operation described here is performed again using the modulation phase $\Psi(r\uparrow)$ in which the degree of increase/decrease of the amplitude $A_n$ from the basic modulation state is reduced), so that the intensities can be made close to a uniform intensity.

By repeating the above operation using the new modulation state obtained here as the basic modulation state, the intensities of the laser beams can be made further closer to a uniform intensity.

The two-dimensional photonic crystal laser according to the present invention may adopt a configuration in which the two-dimensional lattice is a square lattice, and a second modified refractive index region having a refractive index different from the refractive index of the base member is further disposed at second lattice points which are lattice points of a square lattice having the same period length a as the period length of the two-dimensional lattice and shifted from the two-dimensional lattice, or at positions shifted from the second lattice points by a different shift amount each.

The two-dimensional photonic crystal layer to which such a second modified refractive index region is added has a double lattice structure in which a first square lattice (the two-dimensional lattice) in which the modified refractive index region is disposed and a second square lattice having the same period length as the first square lattice and in which second modified refractive index regions are disposed at the lattice points (the second lattice points) are disposed to be shifted from each other. In such a two-dimensional photonic crystal layer, a phase difference between first light that is light traveling in a direction inclined by 45° with respect to two basic translation vectors of these square lattices and having a wavelength of $2^{1/2}a$, and reflected by the modified refractive index region to have the traveling direction changed by 180°, and second light that is light traveling in the same direction with the same wavelength and phase as those of the light, and reflected by the second modified refractive index region to have the traveling direction changed by 180° has a different value according to the direction and magnitude of the above-described shift. In a case where the phase difference (defined in a range of 0 to 2n) is within a range larger than (½)π and smaller than (3/2)π, the first light and the second light are weakened by interference, and the intensity of light whose traveling direction changes in a direction other than 180° in the modified refractive index region or the second modified refractive index region becomes relatively large. This makes it possible to obtain stable laser oscillation over a wider area in the two-dimensional photonic crystal layer than in the case where there is no second modified refractive index region. On the other hand, in a case where the phase difference is within a range smaller than (½)π or larger than (3/2)π, the first light and the second light are strengthened by interference, and laser oscillation is obtained in a narrower area in the two-dimensional photonic crystal layer than in the case where there is no second modified refractive index region.

For example, a configuration may be adopted in which the second lattice point is disposed at a position shifted from the lattice point of the two-dimensional lattice by a distance larger than 0.25 a and smaller than 0.75 a in the same direction as one of basic translation vectors of the two-dimensional lattice. In this case, the shift amount between the lattice point of the two-dimensional lattice and the second lattice point is preferably between 0.4 a and 0.6 a inclusive, and most preferably 0.5 a. According to such a configuration, the first light and the second light are weakened by interference, and stable laser oscillation can be obtained over a wide area in the two-dimensional photonic crystal layer.

Although the photonic crystal laser that emits two or more beams has been described so far, it is possible to obtain a photonic crystal laser that emits a laser beam (wide cross-sectional area beam) having a wide cross-sectional area as described below by applying the above-described method.

That is, the two-dimensional photonic crystal laser according to the present invention may adopt a configuration in which the modulation phase $\Psi(r\uparrow)$ is modulated so as to periodically change with a predetermined modulation period in a direction parallel to the two-dimensional photonic crystal layer, and the modulation period continuously increases or decreases.

As a result, a laser that emits the wide cross-sectional area beam is obtained. In this case, the modulation phase $\Psi(r\uparrow)$ expressed by the right side of Expression (1) has the above modulation period. Hereinafter, the two-dimensional photonic crystal laser having such a configuration is referred to as "wide cross-sectional area laser of a first mode".

The wide cross-sectional area laser of the first mode is formed such that the modulation phase $\Psi(r\uparrow)$ of each of the plurality of modified refractive index regions is modulated so as to periodically change in a direction parallel to the two-dimensional photonic crystal layer, and the modulation period continuously increases or decreases in the direction. By supplying an electric current into the active layer from only the single pair of electrodes provided so as to sandwich the two-dimensional photonic crystal layer in which the modulation is formed as described above, the active layer generates light emission. The light is introduced over a wide range of the two-dimensional photonic crystal layer. As a result, laser beams having substantially the same intensity are emitted from respective positions in the two-dimensional photonic crystal layer at inclination angles θ corresponding to the modulation period at the positions. Therefore, the laser beams having the different inclination angles θ and substantially the same intensity are emitted in a bunch from the entire photonic crystal region, so that an object can be irradiated with the laser light with a nearly uniform intensity over a range wider than the diameter of a laser beam generated by a normal photonic crystal laser.

The two-dimensional photonic crystal laser according to the present invention may adopt a configuration in which the two-dimensional lattice is a square lattice, and each of the plurality of modified refractive index regions is disposed at a corresponding one of the lattice points of the two-dimensional lattice so as to be shifted from the lattice point in one predetermined direction or a direction different from the one direction by 180°, the one direction being a direction parallel to the two-dimensional photonic crystal layer and inclined from both two directions in which the lattice points are disposed with the lattice point period. The structure of the two-dimensional photonic crystal layer defined here can be suitably used for the wide cross-sectional area laser of the first mode, but may be applied to the other two-dimensional photonic crystal lasers according to the present invention.

By disposing the modified refractive index region at each lattice point of the two-dimensional lattice so as to be shifted in the direction inclined from the two directions in which the lattice points are disposed with the lattice point period or in the direction different from the one direction by 180° as described above, an asymmetrical structure is obtained, so that laser oscillation can be caused to occur only at one band edge of a plurality of photonic bands formed by a two-dimensional photonic crystal. Since the laser oscillation is caused to occur only at one band edge (no laser oscillation occurs at other band edges) as described above, a laser beam having a single resonant mode and single-polarized light can be emitted.

In the case where the one direction or the direction different from the one direction by 180° is specified as the shift direction of the modified refractive index region as described above, the modulation is formed such that a distance (corresponding to the shift amount) of the modified refractive index region from the lattice point or/and the area of a planar shape of the modified refractive index region periodically change(s) with the modulation period.

In addition, the wide cross-sectional area laser of the first mode may be a two-dimensional photonic crystal laser array (also referred to as "two-dimensional photonic crystal surface emitting laser array") including:

a plurality of the two-dimensional photonic crystal lasers according to the present invention having the modulations different from each other; and an electric current supply part configured to simultaneously supply an electric current to the pairs of electrodes individually provided in the plurality of two-dimensional photonic crystal lasers. By simultaneously supplying electric current from the electric current supply parts to the plurality of two-dimensional photonic crystal lasers having the modulations different from each other as described above, it is possible to irradiate a wider range with laser light than in the case where the single two-dimensional photonic crystal laser according to the present invention is used.

The two-dimensional photonic crystal laser array may adopt a configuration in which the electric current supply part includes a mesh electrode in which a plurality of holes are formed in a plate member having conductivity, the two-dimensional photonic crystal laser is disposed in each of the plurality of holes, and in each of the plurality of holes, the plate member around the hole is connected to one of the pair of electrodes, or is one of the pair of electrodes. As a result, an electric current can be supplied to each two-dimensional photonic crystal laser using the mesh electrode, and the laser light emitted from the two-dimensional photonic crystal laser can be released from the hole to the outside of the two-dimensional photonic crystal laser array.

The plurality of holes provided in the mesh electrode may be disposed two-dimensionally or one-dimensionally. When the holes are disposed one-dimensionally, it is preferable that each hole has a long line shape in a direction perpendicular to a disposing direction of the holes. In addition, only one two-dimensional photonic crystal laser or a plurality of two-dimensional photonic crystal lasers may be provided in one hole provided in the mesh electrode.

The wide cross-sectional area laser of the first mode can also be defined as follows. That is, the wide cross-sectional area laser of the first mode includes:

a) only one pair of electrodes;

b) an active layer provided between the pair of electrodes and configured to generate light including a predetermined wavelength 4 upon being supplied with an electric current from the electrodes; and c) a two-dimensional photonic crystal layer provided between any one of the pair of electrodes and the active layer and including a plate-shaped base member and a plurality of modified refractive index regions disposed in the base member and having a refractive index different from a refractive index of the base member, in which at a corresponding one of lattice points of a two-dimensional lattice in which the lattice points are periodically disposed with a lattice point period corresponding to the predetermined wavelength $\lambda_L$, each of the plurality of modified refractive index regions is disposed to be shifted by a different shift amount each from the lattice point, or/and each of the plurality of modified refractive index regions is disposed with a different area of a planar shape each, and the shift amount or/and the area of the planar shape of each of the plurality of modified refractive index regions is/are modulated so as to periodically change with a predetermined modulation period in a direction parallel to the two-dimensional photonic crystal layer, and the modulation period continuously increases or decreases.

Emitting the laser beam having a single resonant mode and single-polarized light by limiting the shift direction of the modified refractive index region to the one direction or the direction different from the one direction by 180° as described above in the wide cross-sectional area laser of the first mode can be used not only in the case where the laser beams having the different inclination angles θ and substantially the same intensity are emitted in a bunch as described above, but also in a case where (one) laser beam having a different inclination angle θ is emitted by changing an electric current supply position as described in Patent Literature 1. Such a two-dimensional photonic crystal laser adopts a configuration of including:

a) a pair of electrode groups including electrode groups of which at least one group includes a plurality of partial electrodes;

b) an active layer provided between the pair of electrode groups and, upon being supplied with an electric current from one of the plurality of partial electrodes, configured to generate light including a predetermined wavelength $\lambda_L$ at a position corresponding to the partial electrode from which the electric current is supplied; and c) a two-dimensional photonic crystal layer provided between any one of the pair of electrode groups and the active layer and including a plate-shaped base member and a plurality of modified refractive index regions disposed in the base member and having a refractive index different from a refractive index of the base member, in which at a corresponding one of lattice points of a square lattice in which the lattice points are periodically disposed with a lattice point period corresponding to the predetermined wavelength λL, each of the plurality of modified refractive index regions is disposed to be shifted from the lattice point in one predetermined direction or a direction different from the one direction by 180°, the one direction being a direction parallel to the two-dimensional photonic crystal layer and inclined from both two directions in which the lattice points are disposed with the lattice point period, and in a direction parallel to the two-dimensional photonic crystal layer, a distance from the lattice point or/and an area of a planar shape of each of the plurality of modified refractive index regions is/are modulated so as to periodically change with a predetermined modulation period, and the modulation period varies depending on a position in the two-dimensional photonic crystal layer.

In this case, the modulation period does not need to continuously increase or decrease in the direction parallel to the two-dimensional photonic crystal layer, and may change randomly, for example. In the case where the modulation period does not continuously increase or decrease, the inclination angle θ of the laser beam can be changed by moving the electric current supply position (changing the partial electrode that supplies an electric current).

In the wide cross-sectional area laser of the first mode, light interference may cause intensity unevenness in a cross-section. Hence, a configuration for inhibiting occurrence of such unevenness is further studied. First, a state in which the modulation phase $\Psi(r\uparrow)$ of each of the plurality of modified refractive index regions is modulated so as to periodically change with the predetermined modulation period in the direction parallel to the two-dimensional photonic crystal layer, and the modulation period continuously increases or decreases as in the first mode, is referred to as "basic modulation state" in this example. For example, in a case where the two-dimensional lattice is a square lattice, the inclination angle and the azimuthal angle of laser light emitted from each position (x, y) of the lattice point are defined as θ(x, y) and φ(x, y), respectively. Moreover, angles $\theta_x(x)$ and $\theta_y(y)$ defined by $\sin\theta_x(x)=\sin\theta(x, y)\cos\varphi(x, y)$ and $\sin\theta_y(y)=\sin\theta(x, y)\sin\varphi(x, y)$ are defined. In this case, a modulation phase Ψ(x, y) for each position (x, y) is obtained as

[Expression 6]

$$\Psi(x, y) = \frac{2\pi}{a}\left(\frac{x}{2} + \frac{y}{2} - \frac{\cos\theta_x(x)}{\theta'_x(x)\cdot\sqrt{2}\,n_{eff}} - \frac{\cos\theta_y(y)}{\theta'_y(y)\cdot\sqrt{2}\,n_{eff}}\right), \tag{6}$$

from Expression (1). The modified refractive index region is disposed to be modulated with the modulation phase Ψ(x, y) at each position (x, y) of the lattice point as described above, so that two beams of laser light are emitted from each position (x, y) in different directions from each other (the azimuthal angles of the two beams are different from each other by 180°). These beams are converged to obtain two wide cross-sectional area beams.

The adjustment using $c_n=A_n\exp(i\alpha_n)$ described above is applied to the modulation phase Ψ(x, y) expressed as described above as follows. First, the modulation phase $\Psi(r\uparrow)$ at each position $r\uparrow=(x, y)$ is obtained (that is, the basic modulation state is obtained) as in Expression (6) without considering the term of $c_n=A_n\exp(i\alpha_n)$. Moreover, a radiated electric field distribution $E_{rad}(r\uparrow)$ indicating a distribution of an electric field radiated from each position (at each position) in the two-dimensional photonic crystal layer is obtained by calculation. Such calculation of the electric field distribution can be performed by a method used in designing a conventional two-dimensional photonic crystal laser. By performing a Fourier transform on the radiated electric field distribution field $E_{rad}(r\uparrow)$, a far electric field distribution $E_{far}(K\uparrow)$ indicating a distribution of an electric field at a position separated from the two-dimensional photonic crystal layer (for example, a position where an object is irradiated with the laser beam) is obtained by Expression (7) below.

[Expression 7]

$$E_{far}(K\uparrow) = C\int\int E_{rad}(r\uparrow)\exp(iK\uparrow\cdot r\uparrow)dr\uparrow \tag{7}$$

Here, $K\uparrow$ is a wave number.

On the other hand, an electric field distribution (referred to as "target far electric field distribution") to be formed at a position separated from the two-dimensional photonic crystal layer is optionally defined as $E_{far\_iFFT}(K\uparrow)$. The target far electric field distribution $E_{far\_iFFT}(K\uparrow)$ can be obtained, for example, by updating an intensity distribution to a uniform distribution while maintaining a phase distribution of the electric field in the far electric field distribution $E_{far}(K\uparrow)$ obtained by Expression (7). A target radiated electric field distribution $E_{rad\_iFFT}(r\uparrow)$, which is an electric field distribution to be radiated from the two-dimensional photonic crystal layer in order to obtain such a target far electric field distribution $E_{far\_iFFT}(K\uparrow)$, is obtained by Expression (8) below by performing an inverse Fourier transform on the target far electric field distribution $E_{far\_iFFT}(K\uparrow)$.

[Expression 8]

$$E_{rad\_IFFT}(r\uparrow) = C\int\int E_{far\_iFFT}(K\uparrow)\exp(iK\uparrow\cdot r\uparrow)dK\uparrow \tag{8}$$

Hence, the modulation phase $\Psi(r\uparrow)$ at each position $r\uparrow=(x, y)$ is adjusted such that the radiated electric field distribution $E_{rad}(r\uparrow)$ obtained from the modulation phase $\Psi(r\uparrow)$ at each position $r\uparrow=(x, y)$ becomes closer to the target radiated electric field distribution $E_{rad\_iFFT}(r\uparrow)$ obtained by Expression (8). For example, Expression (8) is applied to Expression (9) below

[Expression 9]

$$\Psi(r\uparrow) = \arcsin\left[\pm\frac{\mathrm{Real}[E_{rad\_iFFT}(r\uparrow)]}{\mathrm{Max}\{\mathrm{Real}[E_{rad\_iFFT}(r\uparrow)]\}}\right], \tag{9}$$

so that the modulation phase $\Psi(r\uparrow)$ after the adjustment can be determined. In Expression (9), "Real" refers to the real part of a complex number. In addition, "Max{Real[$E_{rad\_iFFT}(r\uparrow)$]}" is a maximum value of {Real[$E_{rad\_iFFT}(r\uparrow)$] at each of a large number of positions corresponding to $r\uparrow$, and has a role of normalizing Real[$E_{rad\_iFFT}(r\uparrow)$] at each position. The radiated electric field distribution $E_{rad}(r\uparrow)$ is obtained using the modulation phase $\Psi(r\uparrow)$ after the adjustment, and the far electric field distribution $E_{far}(K\uparrow)$ is obtained from Expression (9) by using this radiated electric field distribution $E_{rad}(r\uparrow)$. The far electric field distribution $E_{far}(K\uparrow)$ obtained in the second time usually becomes closer to the target far electric field distribution $E_{far\_iFFT}(K\uparrow)$ than the far electric field distribution $E_{far}(K\uparrow)$ obtained in the first time.

Since each point can be expressed as a S function by discretizing the target radiated electric field distribution $E_{rad\_iFFT}(r\uparrow)$ with respect to each wave number, the modulation phase $\Psi(r\uparrow)$ after such adjustment is equivalent to the original modulation phase $\Psi(r\uparrow)$ expressed in Expression (1) to which a correction coefficient (constant) is added. In other words, the above adjustment is equivalent to adjustment performed by adding an appropriate correction coefficient to the original modulation phase $\Psi(r\uparrow)$. The modulation phase $\Psi(r\uparrow)$ after the adjustment is expressed using a correction coefficient $\Delta\Psi$ as

[Expression 10]

$$\Psi(r\uparrow) = \arg\left[\int\int\sum_n A_n\exp(i\alpha_n)\delta(k\uparrow - k_n\uparrow)\exp(ik\uparrow\cdot r\uparrow)dk\uparrow\right] + \Delta\Psi. \tag{10}$$

For example, $\pi/2$ can be used as the correction coefficient $\Delta\Psi$.

A new target far electric field distribution $E_{far\_iFFT}(K\uparrow)$ is determined by updating an intensity distribution to a uniform distribution while maintaining a phase distribution as in the above-described example, by using the far electric field distribution $E_{far}(K\uparrow)$ obtained in the second time. Subsequently, an operation of obtaining the next far electric field distribution $E_{far}(K\uparrow)$ by the same operation as the operation of obtaining the far electric field distribution $E_{far}(K\uparrow)$ in the second time is repeated. After this operation is repeated any number of times, a final target far electric field distribution $E_{rad\_iFFT}(K\uparrow)$ is determined, and the modulation phase $\Psi(r\uparrow)$ for each position $r\uparrow=(x, y)$ adjusted nearest to the final target far electric field distribution $E_{far\_iFFT}(K\uparrow)$ (for example, by using Expression (9)) is determined as a final parameter that determines the shift amount or/and the area of each of the plurality of modified refractive index regions. As a result, a wide cross-sectional area beam close to the final target far electric field distribution $E_{far\_iFFT}(K\uparrow)$ and having high uniformity of intensity in its cross-section can be obtained.

In summary, in the two-dimensional photonic crystal laser according to the present invention, in a wide cross-sectional area laser of a second mode, the modulation phase $\Psi(r\uparrow)$ of each of the plurality of modified refractive index regions is adjusted from a basic modulation state in which the modulation phase $\Psi(r\uparrow)$ is modulated so as to periodically change with a predetermined modulation period in a direction parallel to the two-dimensional photonic crystal layer and the modulation phase continuously increases or decreases such that a radiated electric field distribution indicating a distribution of an electric field radiated from the two-dimensional photonic crystal layer in the basic modulation state becomes closer to a target radiated electric field distribution obtained by performing an inverse Fourier transform on a predetermined target far electric field distribution to be formed at a position separated from the two-dimensional photonic crystal layer.

The wide cross-sectional area laser of the second mode can also be defined as follows. That is, the wide cross-sectional area laser of the second mode includes:

a) a pair of electrodes;

b) an active layer provided between the pair of electrodes and configured to generate light of a predetermined wavelength upon being supplied with an electric current from the electrodes; and c) a two-dimensional photonic crystal layer provided between any one of the pair of electrodes and the active layer and including a plate-shaped base member and a plurality of modified refractive index regions disposed in the base member and having a refractive index different from that of the base member, in which the plurality of modified refractive index regions are disposed to be shifted by different shift amounts from respective lattice points of a two-dimensional lattice which are periodically disposed in the base member with a period corresponding to the predetermined wavelength, or/and are disposed at the respective lattice points with different areas, and the shift amount or/and the area of each of the plurality of modified refractive index regions is adjusted from a basic modulation state in which the shift amount or/and the area is/are modulated so as to periodically change with a predetermined modulation period in a direction parallel to the two-dimensional photonic crystal layer and the modulation phase continuously increases or decreases such that a radiated electric field distribution indicating a distribution of an electric field radiated from the two-dimensional photonic crystal layer in the basic modulation state becomes closer to a target radiated electric field distribution obtained by performing an inverse Fourier transform on a predetermined target far electric field distribution to be formed at a position separated from the two-dimensional photonic crystal layer.

Advantageous Effects of Invention

According to the present invention, it is possible to obtain a two-dimensional photonic crystal laser that emits more than two laser beams.

In addition, according to the wide cross-sectional area laser of the first mode in the present invention, it is possible to irradiate an object with laser light over a wide range. Furthermore, according to the wide cross-sectional area laser of the second mode, it is possible to irradiate an object with laser light with a nearly uniform intensity over a wide range.

DESCRIPTION OF EMBODIMENTS

Embodiments of a two-dimensional photonic crystal laser according to the present invention will be described with reference to FIGS. 1 to 31.

(1) First Embodiment

Figure 1A:
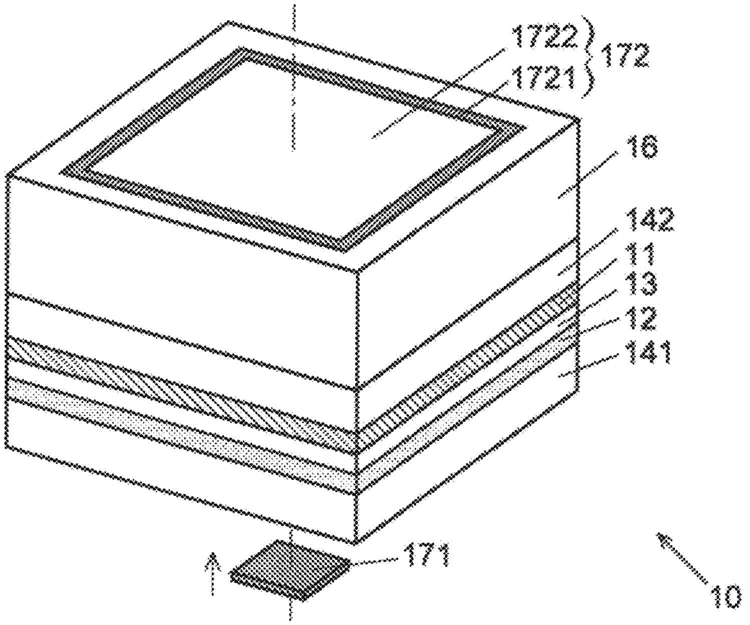
FIG. 1A is a perspective view illustrating a first embodiment of a two-dimensional photonic crystal laser according to the present invention.

As illustrated in FIG. 1A, a two-dimensional photonic crystal laser 10 of the first embodiment has a configuration in which a first electrode 171, a first cladding layer 141, a two-dimensional photonic crystal layer 12, a spacer layer 13, an active layer 11, a second cladding layer 142, a substrate 16, and a second electrode 172 are sequentially stacked in the above-described order. However, the order of the active layer 11 and the two-dimensional photonic crystal layer 12 may be opposite to that described above. In FIG. 1A, for convenience, the first electrode 171 is illustrated as a lower side, and the second electrode 172 is illustrated as an upper side. However, the orientation of the two-dimensional photonic crystal laser 10 at the time of use is not limited to that illustrated in FIG. 1A. Hereinafter, the configurations of the layers and the electrodes will be described.

The active layer 11 emits light within a specific wavelength band upon being supplied with electric charges from the first electrode 171 and the second electrode 172. As a material of the active layer 11, for example, an InGaAs/AlGaAs multiple quantum well (emission wavelength band: 935 to 945 nm) can be used.

Figure 1B:
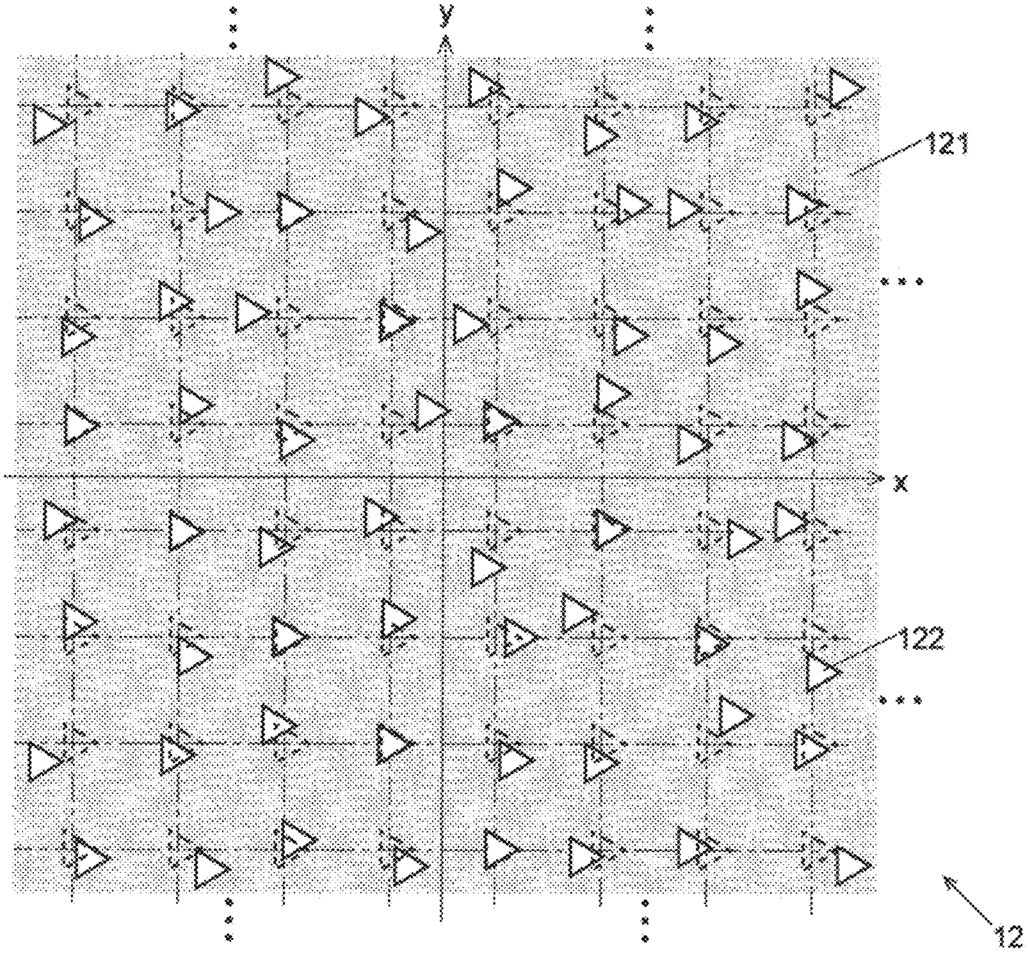
FIG. 1B is a partial plan view of a two-dimensional photonic crystal layer included in the two-dimensional photonic crystal laser.

As illustrated in FIG. 1B, in the two-dimensional photonic crystal layer 12, modified refractive index regions 122 having a refractive index different from that of a plate-shaped base member 121 are disposed one by one for lattice points of a two-dimensional lattice. FIG. 1B illustrates only a part of the two-dimensional photonic crystal layer 12 in an enlarged manner. In an actual two-dimensional photonic crystal layer 12, a large number of modified refractive index regions 122 are disposed over a range equivalent to an outer edge of a planar shape (described later) of the second electrode 172. In the first embodiment, the two-dimensional lattice is a square lattice, but another two-dimensional lattice such as a rectangular lattice or a triangular lattice may be used. A lattice point period (length) a of the square lattice is appropriately determined according to a material of the base member 121 and the emission wavelength band in the active layer 11. For example, p-type GaAs (p-type semiconductor) can be used as the material of the base member 121. Although an air hole is typically used for the modified refractive index region 122, a member having a refractive index different from that of the base member 121 may be used instead of the air hole. A position where the modified refractive index region 122 is disposed and a planar shape will be described in detail later.

The first cladding layer 141 and the second cladding layer 142 have a role of supplying electric charges from the first electrode 171 and the second electrode 172 and a role of inhibiting in-plane guided light guided in parallel with the two-dimensional photonic crystal layer 12 within this layer from leaking from this layer. In order to play the former role, a p-type semiconductor (for example, p-type $Al_{0.37}Ga_{0.63}As$) is used for the first cladding layer 141, and an n-type semiconductor (for example, n-type $Al_{0.37}Ga_{0.63}As$) is used for the second cladding layer 142 (the reason why the p-type semiconductor is used as the material of the base member 121 of the two-dimensional photonic crystal layer 12 is also the same as above).

The spacer layer 13 is provided to inhibit electrons supplied from the second electrode 172 from passing through the active layer 11 (to combine with electron holes on the first electrode 171 side of the active layer 11) while allowing electron holes supplied from the first electrode 171 to pass and to be introduced into the active layer 11. For example, p-type $Al_{0.45}Ga_{0.55}As$ can be used as a material of the spacer layer 13.

The substrate 16 having a sufficiently larger thickness than the other layers is used in order to maintain a mechanical strength of the entire two-dimensional photonic crystal laser 10. As a material of the substrate 16, an n-type semiconductor is used for the same reason as that of the second cladding layer 142.

The first electrode 171 has a square shape in the first embodiment. The second electrode 172 has a configuration in which the center of a square metal plate-shaped member whose sides are sufficiently longer than those of the first electrode 171 is hollowed out into a square shape. A portion where the plate-shaped member is hollowed out is referred to as window portion 1722, and a portion where the plate-shaped member is left is referred to as frame portion 1721. The window portion 1722 is provided to allow a laser beam oscillated from the two-dimensional photonic crystal layer 12 to pass as described later. In FIG. 1A, the first electrode 171 and the first cladding layer 141 are separated from each other to illustrate the shape of the first electrode 171, but the first electrode 171 and the first cladding layer 141 are actually in contact with each other.

Figure 2:
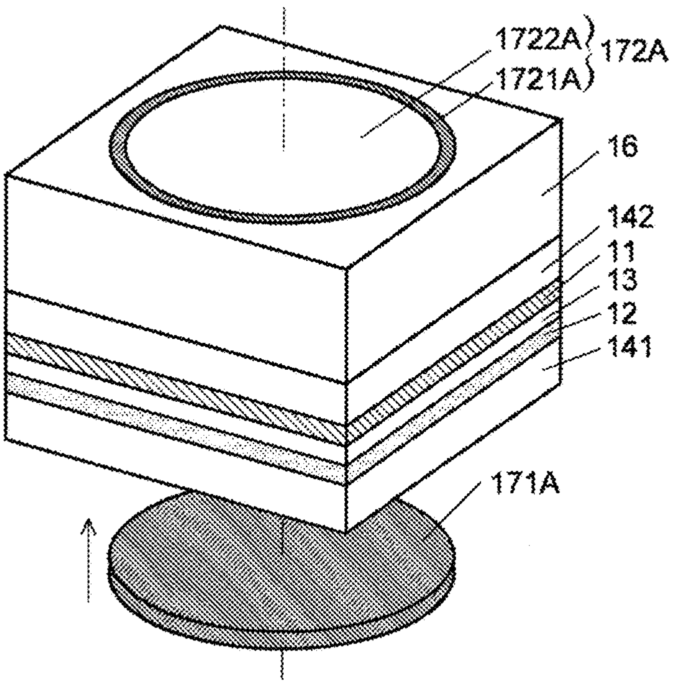
FIG. 2 is a perspective view illustrating an example of a two-dimensional photonic crystal laser having a different electrode shape.

The material of each layer described so far is an example, and other materials may be used. In addition, the shapes of the first electrode 171 and the second electrode 172 are not limited to those described above, and other shapes may be used. For example, as illustrated in FIG. 2, a circular first electrode 171A and a circular second electrode 172A having a frame portion 1721A and a window portion 1722A can be used.

Hereinafter, the position where the modified refractive index region 122 is disposed and the planar shape in the two-dimensional photonic crystal layer 12 will be described in detail.

Figure 3:
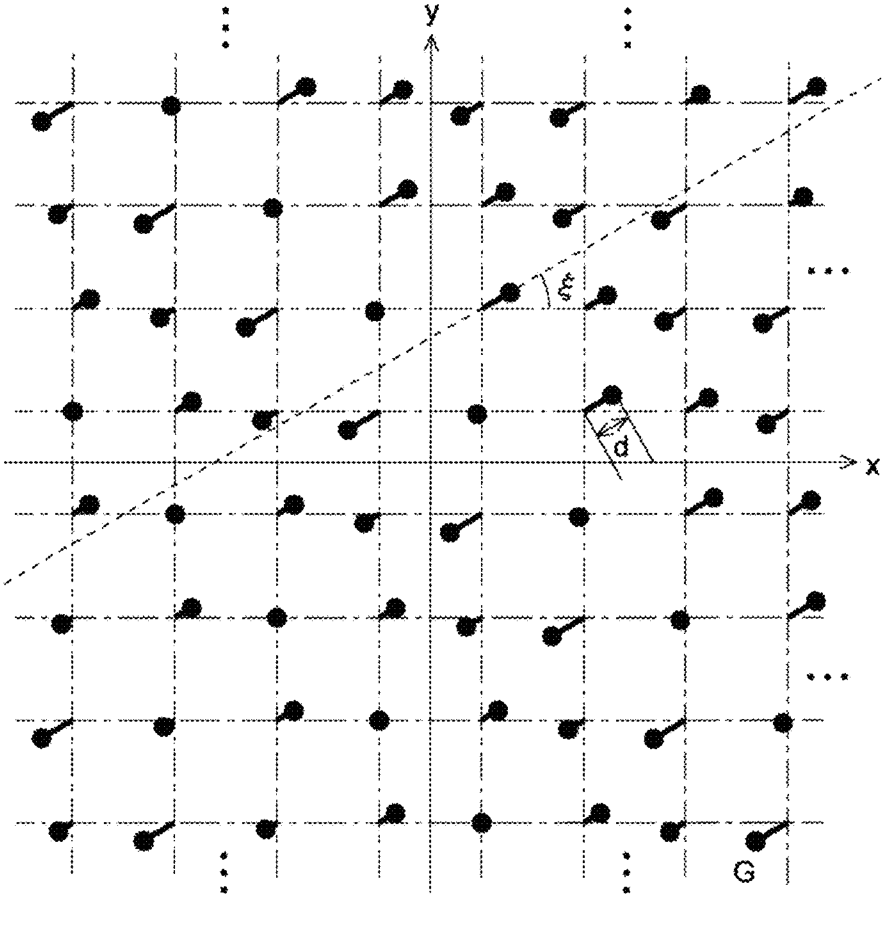
FIG. 3 is a partial plan view illustrating a setting example of positions of the centers of gravity of modified refractive index regions of the two-dimensional photonic crystal layer in the two-dimensional photonic crystal laser of the first embodiment.
Figure 4:
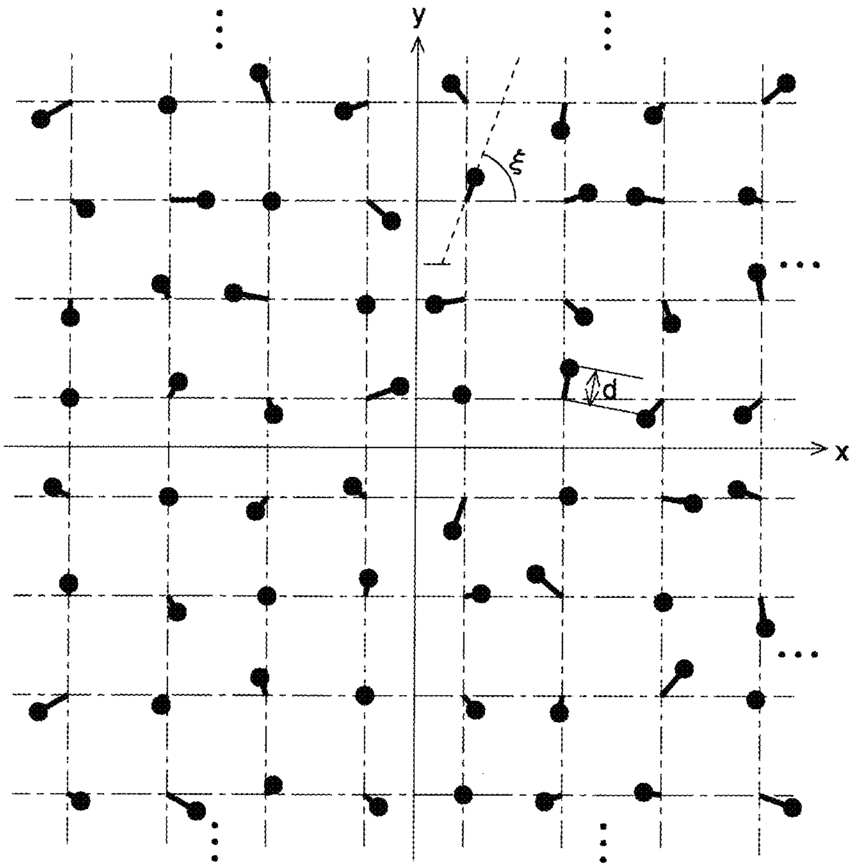
FIG. 4 is a partial plan view illustrating another setting example of the positions of the centers of gravity of the modified refractive index regions of the two-dimensional photonic crystal layer in the two-dimensional photonic crystal laser of the first embodiment.

In an example illustrated in FIG. 1B, the modified refractive index regions 122 whose planar shapes (including their areas) are equal to each other are used. The planar shape is an equilateral triangle in the example of FIG. 1B, but may be an isosceles triangle or other triangles, a polygon other than a triangle, a circle, an ellipse, or the like. In addition, one modified refractive index region may be formed by combining two or more modified refractive index regions (partial modified refractive index regions). In each of the modified refractive index regions 122, the center of gravity of its planar shape is disposed at a position shifted from a lattice point (a point where lengthwise and crosswise alternate long and short dash lines intersect in FIG. 1B) of the square lattice having the period length a. FIGS. 3 and 4 illustrate examples of this shift amount. In each drawing, a black circle indicates a position of a center of gravity G in the planar shape of the modified refractive index region 122 together with the square lattice (alternate long and short dash lines). In the example of FIG. 3, each center of gravity G is shifted from the lattice point in the same direction (a direction shifted from an x direction by an angle ξ (constant in this example)), and a magnitude d of the shift is set for each lattice point. Here, the magnitude of the shift is defined including positivity and negativity (in a case where the magnitude of the shift is defined only by a positive value, the shift direction includes two directions different from each other by 180°). On the other hand, in the example of FIG. 4, in addition to the magnitude of the shift, a direction of the shift (the angle ξ (variable in this example) in a direction shifted from the x direction) is also set for each lattice point. That is, a vector amount of the shift is set for each lattice point.

In the first embodiment, the vector amount of the shift at each lattice point is modulated so as to have a composite modulation period in which a plurality of periods different from each other are superposed on each other.

Here, a magnitude d(x, y) of the shift at each lattice point expressed by coordinates (x, y) is $$d(x,y) = C_1\cdot\sin(k_1x) + C_2\cdot\sin(k_2x) + C_3\cdot\sin(k_3x) + \ldots + C_n\cdot\sin(k_nx) + B\cdot y \tag{11}$$

($C_1, C_2, C_3, \ldots C_n, k_1, k_2, k_3, \ldots k_n$, and B are all constants). Here, an amplitude $A_n$ and a phase αn in Expression (1) are not considered. When the shift is set as in Expression (11), 2n laser beams (or (2n−1) laser beams including one laser beam having an inclination angle θ of 0°) are obtained in which n laser beams emitted in directions having different inclination angles θ/azimuthal angles φ from each other according to values of $k_1, k_2, k_3, \ldots k_n$ are combined with n laser beams having azimuthal angles different from those of the n laser beams by 180°.

In the example defined by Expression (11), the composite modulation period is applied only in the x direction. However, the composite modulation period may be applied only in a y direction or in both the x direction and the y direction. As an example of the latter case, d(x, y) is $$d(x,y) = C_1\cdot\sin(k_1x) + C_2\cdot\sin(k_2x) + C_3\cdot\sin(k_3x) + \ldots + C_n\cdot\sin(k_nx) + C_{n+1}\cdot\sin(k_{n+1}y) + C_{n+2}\cdot\sin(k_{n+2}y) + C_{n+3}\cdot\sin(k_{n+3}y) + \ldots + C_{n+m}\cdot\sin(k_{n+m}y) \tag{12}$$

($C_1, C_2, C_3, \ldots C_n, C_{n+1}, C_{n+2}, C_{n+3}, \ldots C_{n+m}, k_1, k_2, k_3, \ldots k_n, k_{n+1}, k_{n+2}, k_{n+3} \ldots k_{n+m}$ are all constants). As a result, 2(n+m) laser beams emitted in directions having different inclination angles θ/azimuthal angles φ from each other are obtained.

In the example of FIG. 4, periodicity can be imparted to the shift direction in addition to the magnitude of the shift defined by Expression (11), Expression (12), and the like. For example, an angle ξ(x, y) indicating the shift direction at each lattice point (x, y) is $$\xi(x,y) = C_{n+m+1}\cdot\sin(k_{n+m+1}x) + C_{n+m+2}\cdot\sin(k_{n+m+2}x) \tag{13}$$

(m=0 in a case of combination with Expression (11)). As a result, 2(n+m+2) laser beams are obtained. In a case where the periodicity is imparted to the shift direction only in one of the x direction or the y direction ($C_{n+m+1}$ or $+C_{n+m+2}$ is 0 in Expression (13)), 2(n+m+1) laser beams are obtained. Alternatively, 2×2=4 laser beams are obtained by applying different modulations from each other to the x direction and the y direction with respect to the shift direction without applying a modulation to the magnitude of the shift (n=0, m=0).

Figure 5:
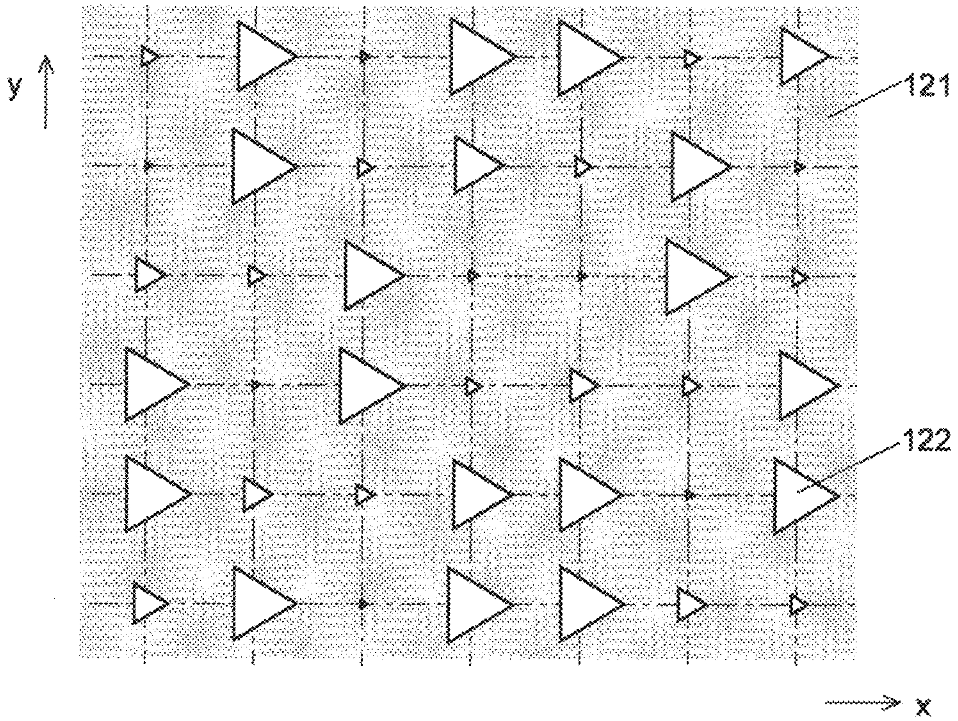
FIG. 5 is a partial plan view illustrating a setting example of areas of the modified refractive index regions of the two-dimensional photonic crystal layer in the two-dimensional photonic crystal laser of the first embodiment.

Although the modulation of the shift amount has been described so far, the area of the modified refractive index region 122 can be modulated instead of the shift amount (FIG. 5). Similarly to Expression (11) and Expression (12), an area S(x, y) of the modified refractive index region 122 at each lattice point expressed by the coordinates (x, y) is $$S(x,y) = S_1\cdot\sin(k_1x) + S_2\cdot\sin(k_2x) + S_3\cdot\sin(k_3x) + \ldots + S_n\cdot\sin(k_nx) + D\cdot y \tag{14}$$

or $$S(x,y) = S_1\cdot\sin(k_1x) + S_2\cdot\sin(k_2x) + S_3\cdot\sin(k_3x) + \ldots + S_n\cdot\sin(k_nx) + S_{n+1}\cdot\sin(k_{n+1}y) + S_{n+2}\cdot\sin(k_{n+2}y) + S_{n+3}\cdot\sin(k_{n+3}y) + \ldots + S_{n+m}\cdot\sin(k_{n+m}y) \tag{15}$$

($S_1$, $S_2$, $S_3$, . . . $S_n$, $S_{n+1}$, $S_{n+2}$, $S_{n+3}$, . . . $S_{n+m}$, $k_1$, $k_2$, $k_3$, . . . $k_n$, $k_{n+1}$, $k_{n+2}$, $k_{n+3}$ . . . $k_{n+m}$, and D are all constants). As a result, 2n or (2n−1) (in the case of Expression (14)), or 2(n+m) or (2(n+m)−1) (in the case of Expression (15)) laser beams emitted in directions having different inclination angles θ/azimuthal angles φ from each other are obtained.

Furthermore, more laser beams can be obtained by combining the shift amount (magnitude and direction) and the area.

Figure 6:
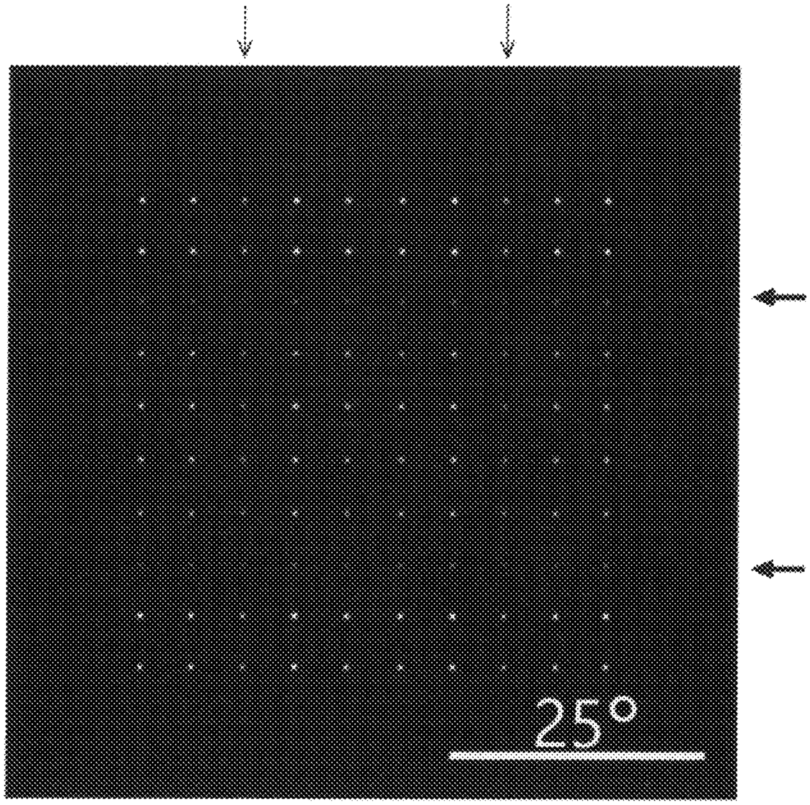
FIG. 6 is a drawing illustrating a result obtained by calculation of a far-field image of laser beams emitted from a two-dimensional photonic crystal laser designed to emit 100 laser beams by forming a composite modulation period in which 50 modulation periods differing in a shift amount and an area from each other are superposed on each other.

FIG. 6 illustrates an example of a calculation result of a far-field image of laser beams emitted from the two-dimensional photonic crystal laser 10 designed to emit 2×50=100 laser beams by forming the composite modulation period in which 50 modulation periods different from each other with respect to the shift amount and the area are superposed on each other. As an emission range, $k_n$↑ corresponding to each modulation period is set such that the inclination angle θ is within a range of ±25° with respect to the x direction and the y direction. In FIG. 6, 100 spots disposed in 10 rows and 10 columns appear, and it has been able to confirm that 100 laser beams are emitted as designed.

However, spots in two rows (20 spots) separated from each other by five rows and indicated by two thick arrows in FIG. 6 have lower intensities than those of the other spots. In addition, 16 spots not included in the two rows in two columns separated from each other by five columns and indicated by two thin arrows have stronger intensities than those of the spots in the two rows, but have slightly weaker intensities than those of the other spots. This is considered to be because of occurrence of light interference when emitting the laser beams from the two-dimensional photonic crystal layer.

Figure 7:
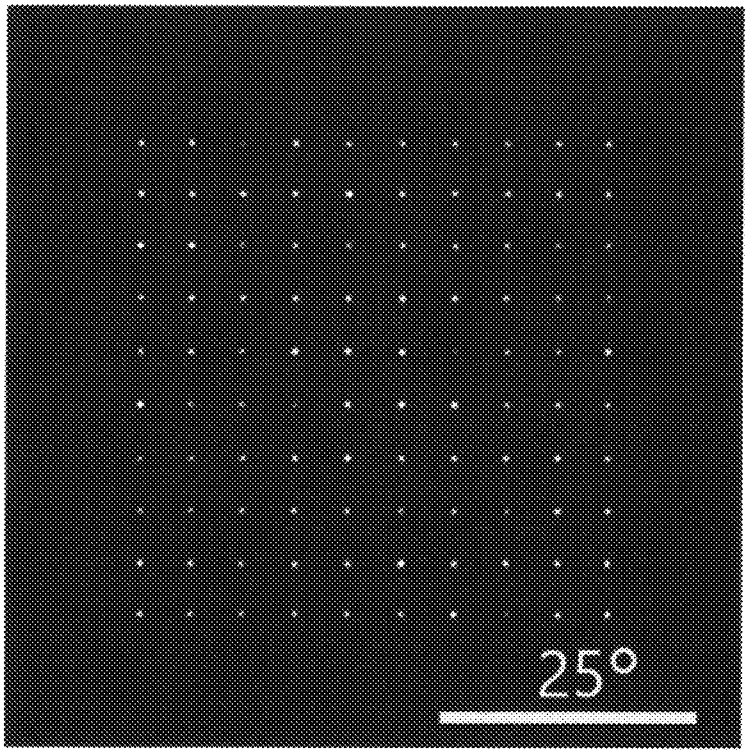
FIG. 7 is a drawing illustrating a result obtained by calculation of a far-field image of laser beams emitted from the two-dimensional photonic crystal laser of the first embodiment.

Hence, in the first embodiment, the far-field image of the laser beams is calculated for the two-dimensional photonic crystal laser 10 having the two-dimensional photonic crystal layer 12 to which a phase $\exp(i\alpha_n)$ is randomly given to each $k_n$↑ (one phase is given to one $k_n$↑ such that the random phases are given when comparing different $k_n$↑) in Expression (1) described above. FIG. 7 illustrates the result. The laser beam spots are at the same positions as in the case of FIG. 6. The intensity of each spot does not appear to be weakened in a specific row or column as in FIG. 6, and is more uniform than in the case of FIG. 6. However, some spots appear to have weaker intensities than those of the other spots.

Figure 8:
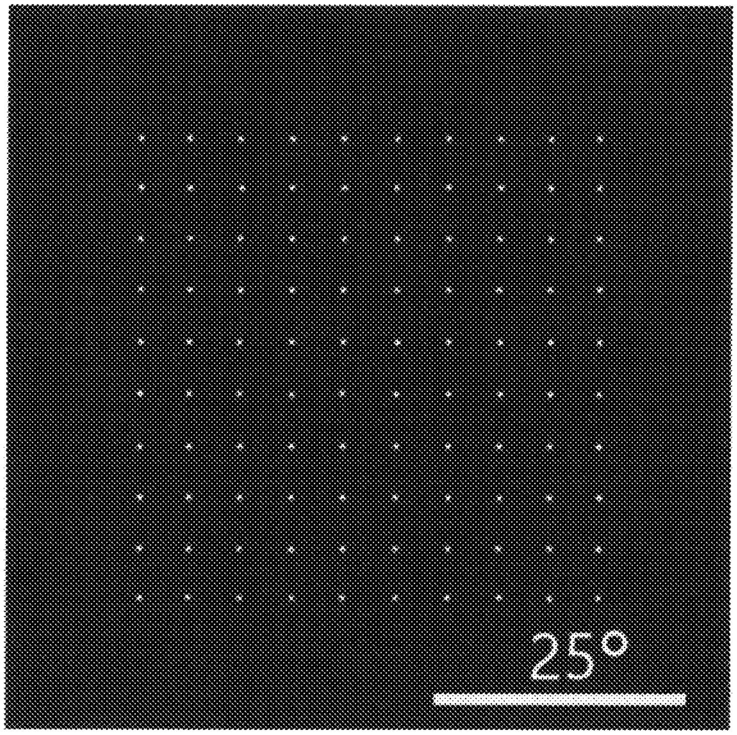
FIG. 8 is a drawing illustrating a result obtained by calculation of a far-field image of laser beams emitted from a two-dimensional photonic crystal laser obtained by improving the two-dimensional photonic crystal laser for which the calculation of FIG. 7 is performed.

Hence, in Expression (1) described above, the intensities of all the spots are adjusted to be as uniform as possible by repeatedly executing an operation of adjusting the magnitude of an amplitude $A_n$ for each $k_n$↑. FIG. 8 illustrates an example of a far-field image of laser beams adjusted as described above. As can be seen from FIG. 8, 100 laser beams having substantially uniform intensities are obtained.

(2) Second Embodiment (Example Using Two-Dimensional Photonic Crystal Having Double Lattice Structure)

Except for the configuration of the two-dimensional photonic crystal layer, a two-dimensional photonic crystal laser of the second embodiment has the same configuration as that of the two-dimensional photonic crystal laser 10 of the first embodiment. Hereinafter, the configuration of a two-dimensional photonic crystal layer 12A in the two-dimensional photonic crystal laser of the second embodiment will be described.

Figure 9:
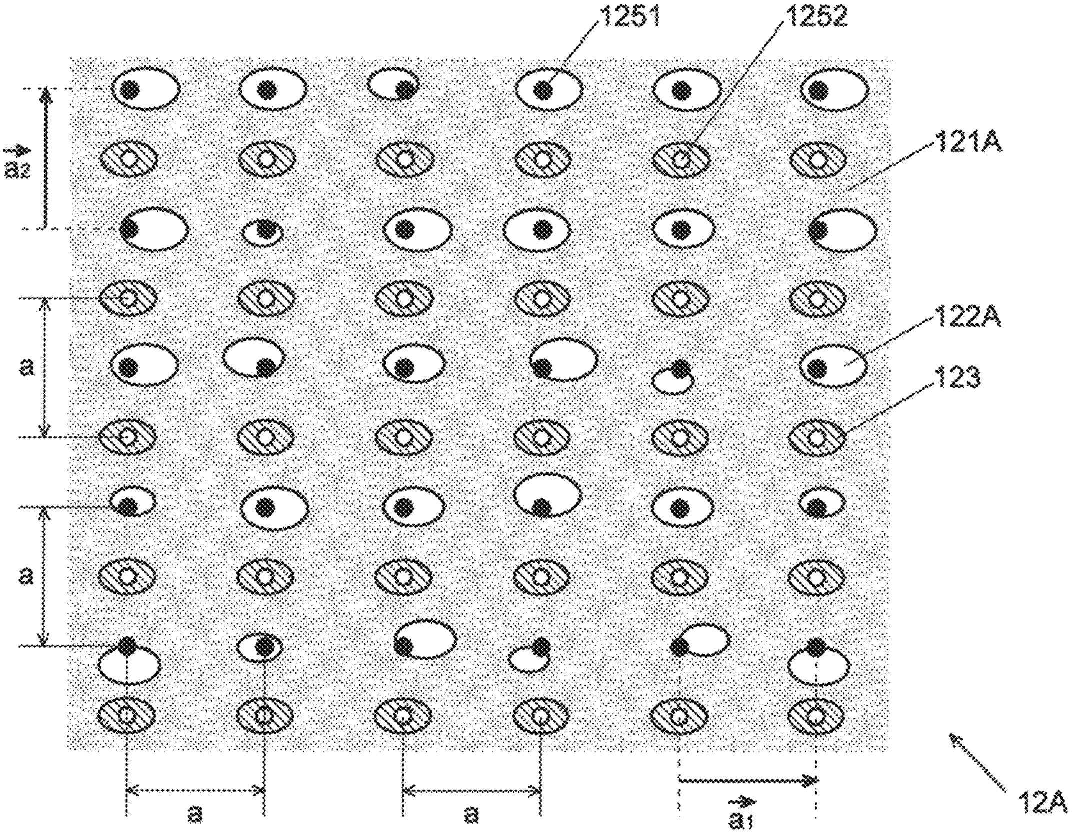
FIG. 9 is a partial plan view of a two-dimensional photonic crystal layer included in a two-dimensional photonic crystal laser of a second embodiment.
Figure 10:
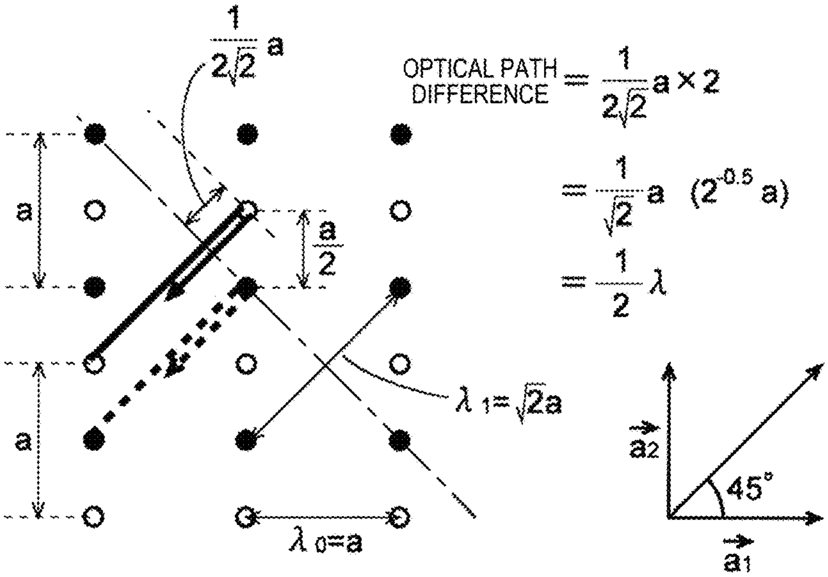
FIG. 10 is a drawing schematically illustrating an example of an optical path difference between light reflected by a modified refractive index region at a first lattice point and light reflected by a second modified refractive index region at a second lattice point, the light traveling in a direction inclined by 45° with respect to a basic translation vector of a square lattice in the two-dimensional photonic crystal laser of the second embodiment.

As illustrated in FIG. 9, in the two-dimensional photonic crystal layer 12A, modified refractive index regions 122A having a refractive index different from that of a base member 121A are disposed, and second modified refractive index regions 123 having a refractive index different from that of the base member 121A are also disposed in the base member 121A. In the present embodiment, both the modified refractive index regions 122A and the second modified refractive index regions 123 are air holes. A member (other than air) having a refractive index different from that of the base member 121A may be used for one or both of the modified refractive index regions 122A and the second modified refractive index regions 123. In this case, the members of the modified refractive index regions 122A and the members of the second modified refractive index regions 123 may be made of the same material, or may be made of materials different from each other.

The modified refractive index regions 122A are disposed to be shifted by predetermined shift amounts (vector values) from first lattice points 1251 of a first square lattice having a period length a and having the first lattice points 1251 indicated by black circles in FIG. 9, and their areas also differ at the respective first lattice points 1251. The shift amounts and the areas of the modified refractive index regions 122A can be set in the same manner as in the first embodiment. The modified refractive index regions 122A have an elliptical shape in the present embodiment, but may have another shape such as an equilateral triangle exemplified in the first embodiment.

The second modified refractive index regions 123 are disposed on second lattice points 1252 of a second square lattice having the period length a and having the second lattice points 1252 indicated by white circles in FIG. 9. The second lattice points 1252 are disposed at positions shifted from the first lattice points 1251 by 0.5 a in a direction parallel to $a_2$↑ out of basic translation vectors $a_1$↑ and $a_2$↑ of the first and second square lattices. In the present embodiment, the second modified refractive index regions 123 have an elliptical shape, and all have the same area. The second modified refractive index regions 123 may have another shape such as an equilateral triangle.

Since the modified refractive index regions 122A are disposed at the first lattice points 1251 and the second modified refractive index regions 123 are disposed at the second lattice points 1252 as described above, light of a wavelength λ of $2^{0.5}$ a among light traveling in a direction of 45° with respect to the basic translation vectors $a_1$↑ and $a_2$↑ is amplified. In this case, among the light of the wavelength λ traveling in the above direction, a difference in optical path length between first light (thick solid-line arrow in FIG. 10) reflected by a certain first lattice point 1251 or the modified refractive index region 122A at a position shifted from the first lattice point 1251 by a predetermined distance to have the traveling direction changed by 180° and second light (thick broken-line arrow in FIG. 10) reflected by the second modified refractive index region 123 at the second lattice point 1252 disposed at a position shifted by 0.5 a from the first lattice point 1251 in the direction of the basic translation vector $a_2$↑ to have the traveling direction changed by 180° is $2^{-0.5}$ a. The beams of light traveling in the direction of 45° with respect to $a_1$↑ and $a_2$↑ are in phase on an alternate long and short dash line illustrated in FIG. 10, and thus, the optical path length is determined with reference to the position of the alternate long and short dash line here. Since the difference in optical path length is $2^{-0.5}$ a as described above, the first light and the second light are weakened by interference (disappear in this example). Therefore, the intensity of light whose traveling direction changes in a direction other than 180° in the modified refractive index region or the second modified refractive index region relatively increases, and stable laser oscillation can be obtained over a wide area in the two-dimensional photonic crystal layer 12A.

Next, for the two-dimensional photonic crystal laser of the second embodiment, a one-dimensional coupling coefficient $\kappa_{1D}$ and a two-dimensional coupling coefficient $\kappa_{2D}$ are obtained by calculation. The one-dimensional coupling coefficient $\kappa_{1D}$ is a coefficient indicating the magnitude of interaction between beams of light traveling in a specific direction in the two-dimensional photonic crystal layer 12A, whereas the two-dimensional coupling coefficient $\kappa_{2D}$ is a coefficient indicating the magnitude of interaction between beams of light traveling in different directions from each other in the two-dimensional photonic crystal layer 12A. As the one-dimensional coupling coefficient KID is Smaller, and as the two-dimensional coupling coefficient $\kappa_{2D}$ is larger, light more easily spreads two-dimensionally in the two-dimensional photonic crystal layer, which means that stable laser oscillation is easily obtained in a wide area. Here, the calculation is performed in many examples with different areas of the second modified refractive index region 123. This means that the larger the area of the second modified refractive index region 123, the more remarkable the influence of the second modified refractive index region 123 on the one-dimensional coupling coefficient $\kappa_{1D}$ and the two-dimensional coupling coefficient $\kappa_{2D}$ appears.

Figure 11A:
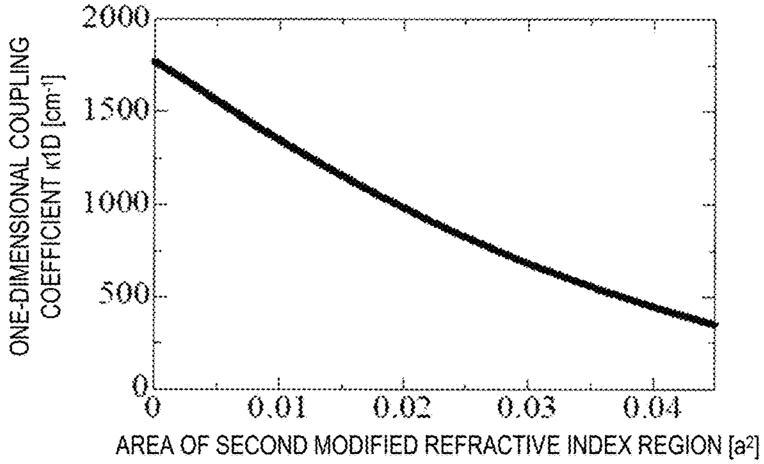
FIGS. 11A and 11B are graphs illustrating results obtained by calculation of a one-dimensional coupling coefficient and of a two-dimensional coupling coefficient, respectively, in the two-dimensional photonic crystal laser of the second embodiment.
Figure 11B:
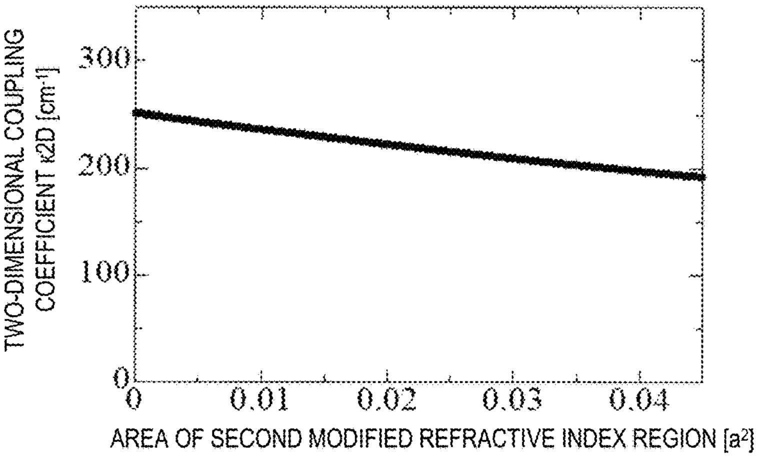

The graph in FIG. 11A illustrates calculation results of the one-dimensional coupling coefficient $\kappa_{1D}$, and the graph in FIG. 11B illustrates calculation results of the two-dimensional coupling coefficient $\kappa_{2D}$. In these graphs, the horizontal axis represents a value obtained by dividing the area of the second modified refractive index region 123 by the square of the period length a of the square lattice. As can been seen from these calculation results, as the area of the second modified refractive index region 123 increases, the one-dimensional coupling coefficient $\kappa_{1D}$ remarkably decreases, whereas the two-dimensional coupling coefficient $\kappa_{2D}$ gradually decreases, which is a gentler decrease than that of the one-dimensional coupling coefficient $\kappa_{1D}$. This result indicates that stable laser oscillation is more easily obtained in a wide area in the two-dimensional photonic crystal layer. In addition, this result is considered to reflect that the beams of light of the wavelength $\lambda$ of $2^{0.5}$ a traveling in the direction of 45° with respect to the basic translation vectors $a_1\uparrow$ and $a_2\uparrow$ are reflected at 180° by the modified refractive index region 122A and the second modified refractive index region 123 to interfere and be weakened.

Figure 12:
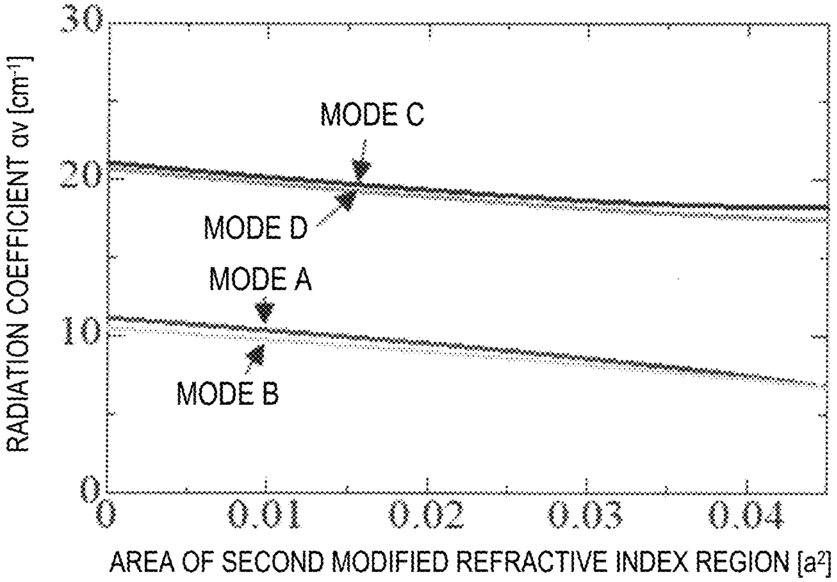
FIG. 12 is a graph illustrating a result obtained by calculation of a radiation coefficient in the two-dimensional photonic crystal laser of the second embodiment.

Next, for the two-dimensional photonic crystal laser of the second embodiment, a radiation coefficient is obtained by calculation. The radiation coefficient is a coefficient $\alpha_v$ when a ratio of light radiated in a direction perpendicular to or inclined from the perpendicular to the two-dimensional photonic crystal layer by diffraction while being guided through a length L to light existing as a waveguide mode in the two-dimensional photonic crystal layer is expressed by $\{\exp(\alpha_v L)-1\}$. As the radiation coefficient $\alpha_v$ is smaller, light is more likely to be confined in the two-dimensional photonic crystal layer 12A. As a result, laser oscillation is more likely to occur. FIG. 12 illustrates the calculation results. In the two-dimensional photonic crystal layer 12A, four oscillation modes of modes A to D may occur near a band edge of a photonic band. Irrespective of the area of the second modified refractive index region 123, the radiation coefficients $\alpha_v$ of the modes C and D are sufficiently larger than the radiation coefficients $\alpha_v$ of the modes A and B. Therefore, laser oscillation by the modes C and D is less likely to occur, and laser oscillation in an unnecessary higher-order mode can be inhibited.

Figure 13A:
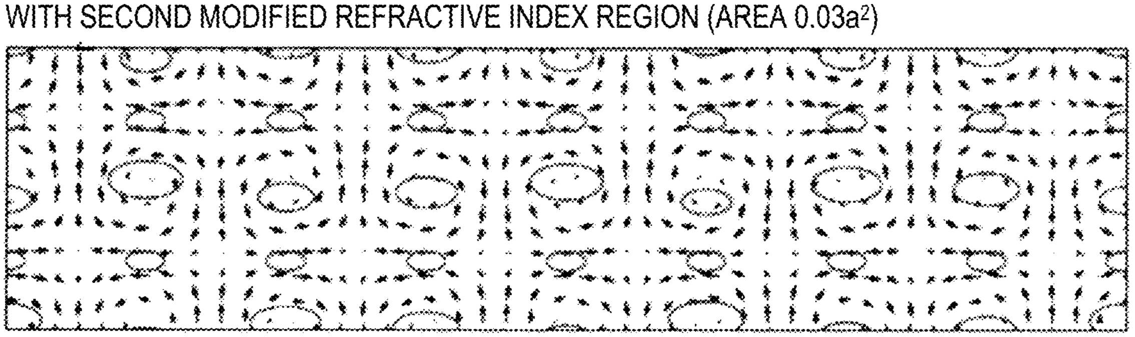
FIGS. 13A and 13B are drawings illustrating results obtained by calculation of an electric field distribution in the two-dimensional photonic crystal layer in the two-dimensional photonic crystal laser of the second embodiment, and in a two-dimensional photonic crystal laser obtained by excluding the second modified refractive index region from the second embodiment, respectively.
Figure 13B:
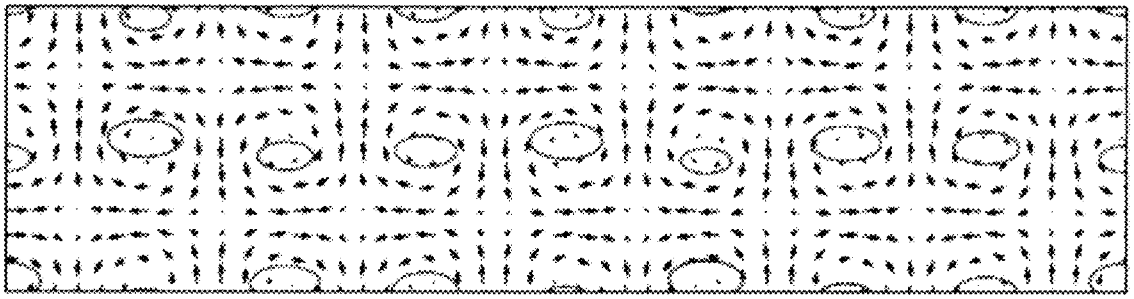

Next, for the two-dimensional photonic crystal laser of the second embodiment, an electric field distribution in the two-dimensional photonic crystal layer 12A is obtained by calculation. In this calculation, the area of the second modified refractive index region 123 is set to 0.03 $a^2$. For comparison, the same calculation is also performed for a case of including a two-dimensional photonic crystal layer having a configuration in which the second modified refractive index regions 123 are removed from the two-dimensional photonic crystal layer 12A. FIG. 13A illustrates the former calculation results, and FIG. 13B illustrates the latter calculation results. In FIGS. 13A and 13B, an arrow direction indicates an electric field direction, and an arrow length indicates an electric field magnitude. As can be seen from FIGS. 13A and 13B, there is no noticeable difference between FIG. 13A and FIG. 13B, and the presence or absence of the second modified refractive index regions 123 does not significantly affect the electric field.

In the second embodiment described so far, the distance between the first lattice point 1251 and the second lattice point 1252 closest to the first lattice point 1251 is set to 0.5 a. However, this distance only needs to be larger than 0.25 a and smaller than 0.75 a. Setting the distance between the first lattice point 1251 and the second lattice point 1252 as described above makes it possible to weaken (even if not completely make disappear), by interference, the light reflected at 180° by the first lattice point 1251 or the modified refractive index region 122A at the position shifted from the first lattice point 1251 by the predetermined distance and the light reflected at 180° by the second modified refractive index region 123 at the second lattice point 1252, among the light of the wavelength $\lambda$ of $2^{0.5}$ a traveling in the direction of 45° with respect to the basic translation vectors $a_1\uparrow$ and $a_2\uparrow$.

In addition, in the second embodiment described so far, the second modified refractive index region 123 is disposed at the second lattice point 1252. However, the second modified refractive index region 123 may be disposed to be shifted from the second lattice point 1252 by a different shift amount (vector value) for each second lattice point 1252, and its area may also differ at each second lattice point 1252.

(3) Third Embodiment (Wide Cross-Sectional Area Laser of First Mode)

Except for the configuration of the two-dimensional photonic crystal layer, a two-dimensional photonic crystal laser of the third embodiment has the same configuration as that of the two-dimensional photonic crystal laser 10 of the first embodiment. Hereinafter, the configuration of a two-dimensional photonic crystal layer 12B in the two-dimensional photonic crystal laser of the third embodiment will be described.

Figure 14:
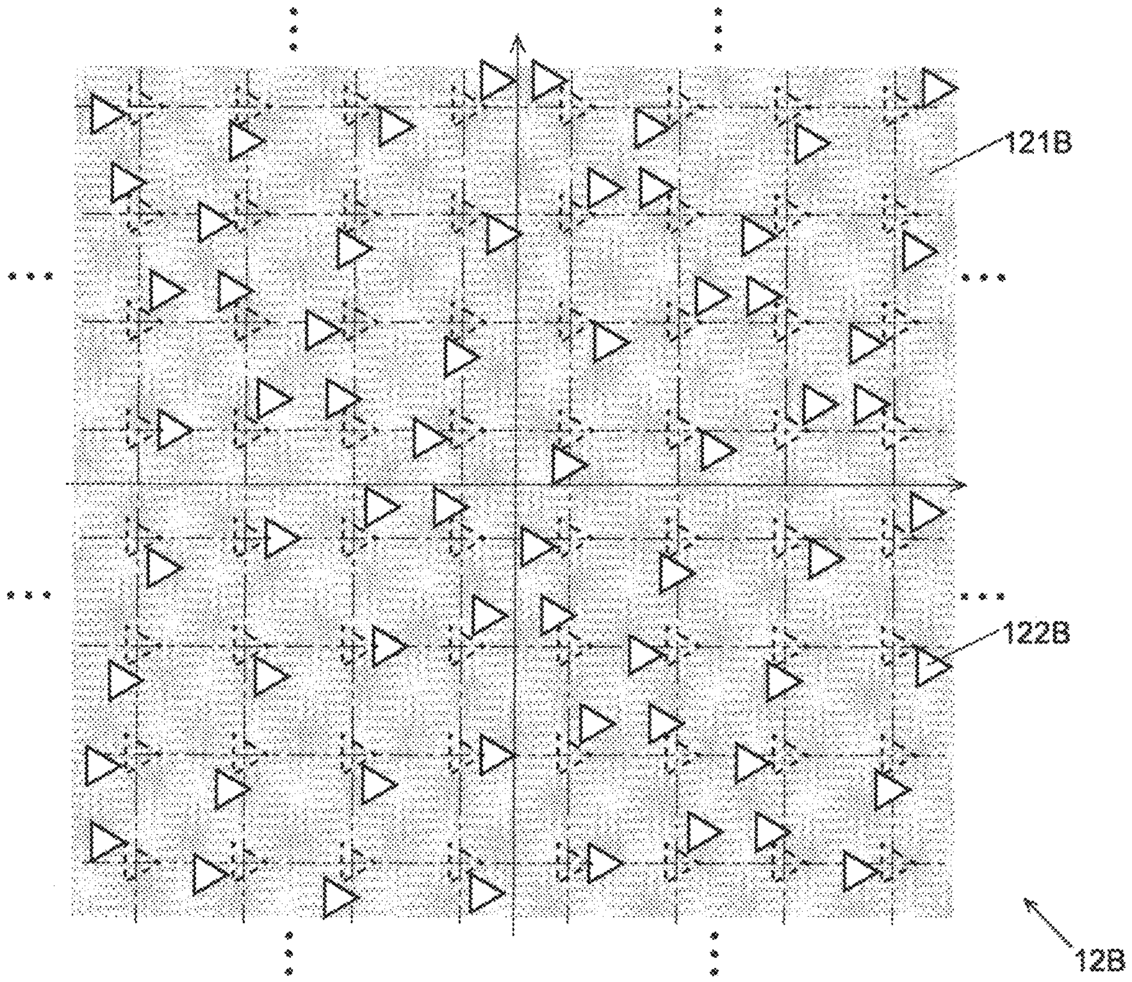
FIG. 14 is a partial plan view of a two-dimensional photonic crystal layer included in a two-dimensional photonic crystal laser of a third embodiment.

As illustrated in FIG. 14, in the two-dimensional photonic crystal layer 12B, a large number of modified refractive index regions 122B whose planar shapes (including their areas) are equal to each other are disposed at positions shifted from lattice points (points where lengthwise and crosswise alternate long and short dash lines intersect in FIG. 14) of a square lattice having a lattice point period a. In order to clearly illustrate this shift, in FIG. 15, a black circle indicates a position of a center of gravity G in the planar shape of the modified refractive index region 122B together with the square lattice (alternate long and short dash lines). Each center of gravity G is shifted from the lattice point of the square lattice by an equal distance d. On the other hand, a line segment (thick solid line in FIG. 15) connecting the center of gravity G and the lattice point is directed in a different direction at each lattice point. This direction is defined by an angle Ψ with respect to a reference line, which is a straight line extending in one (an x direction illustrated in FIG. 15) of two directions in which the lattice points are disposed with the lattice point period a. In this example, since only the angle Ψ is modulated (the distance d and the area of the modified refractive index region 122B are not modulated), the angle Ψ is the modulation phase. A difference in the angle Ψ at each lattice point shows that the angle Ψ periodically changes with a predetermined modulation period in the x direction, and the modulation period gradually decreases. As a result, a phase difference (difference in the angle Ψ) between adjacent lattice points increases as $\Psi_0+\delta$, $\Psi_0+2\delta$, and $\Psi_0+3\delta$ . . . in the x direction. Similarly in a y direction (direction different from the x direction in the two directions), the angle Ψ periodically changes with a predetermined modulation period in the y direction, and the modulation period gradually decreases.

FIG. 14 illustrates the modified refractive index region 122B whose planar shape is an equilateral triangle, but the planar shape of the modified refractive index region 122B is not limited to this shape.

Figure 15:
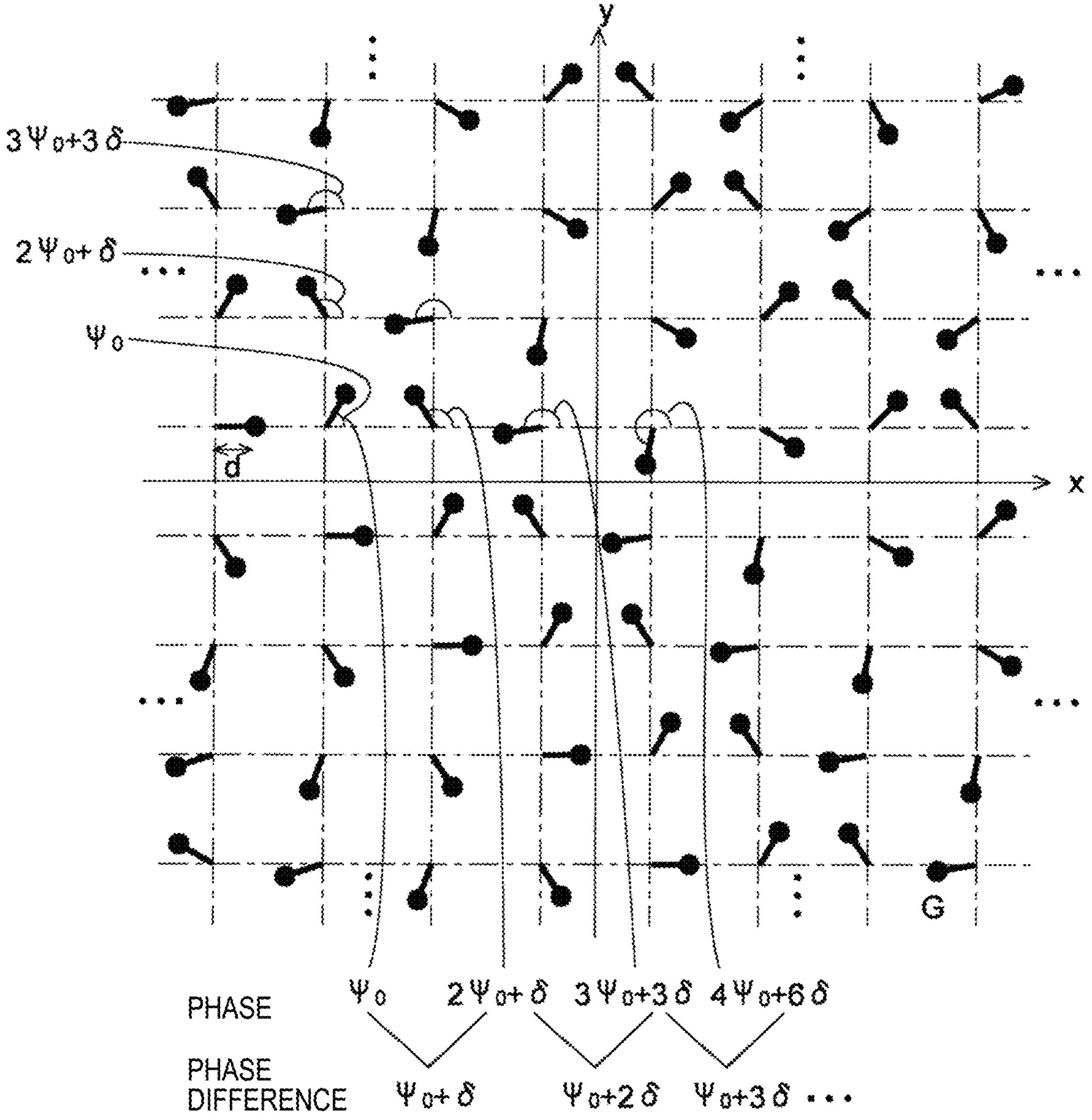
FIG. 15 is a partial plan view illustrating positions of the centers of gravity of modified refractive index regions of the two-dimensional photonic crystal layer in the two-dimensional photonic crystal laser of the third embodiment.
Figure 16:
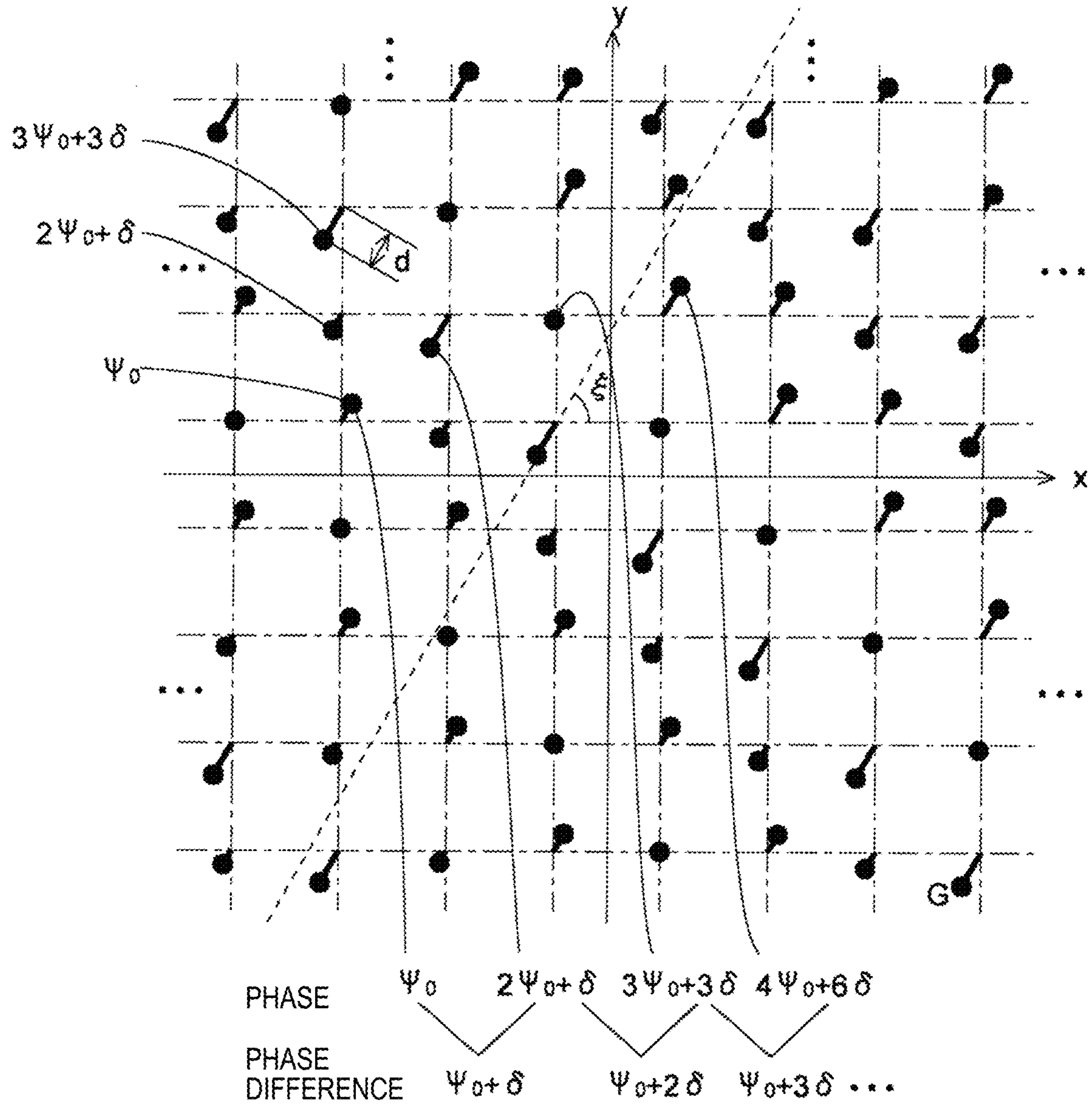
FIG. 16 is a partial plan view illustrating a modification of the positions of the centers of gravity of the modified refractive index regions of the two-dimensional photonic crystal layer in the third embodiment.

FIG. 16 illustrates an example in which the shift of the center of gravity G of the modified refractive index region 122B from the lattice point of the square lattice is different from that in FIG. 15. The planar shape of the modified refractive index region 122B in this example is the same as that illustrated in FIG. 14. In this example, a direction in which the center of gravity G is shifted from the lattice point is a direction shifted from the x direction by the same angle ξ (0°<ξ<90°) ((ξ−90)° from the y direction) at any lattice point. The distance d of the shift of the center of gravity G from the lattice point periodically changes with a predetermined modulation period in the x direction, and the modulation period gradually decreases. In the example of FIG. 16, the distance d at each lattice point changes as $d_{max}\sin\Psi_0$, $d_{max}\sin(2\Psi_0+\delta)$, $d_{max}\sin(3\Psi_0+3\delta)$, $d_{max}\sin(4\Psi_0+6\delta)$ . . . in the x direction. A phase difference in the change of the distance between adjacent lattice points increases as $\Psi_0+\delta$, $\Psi_0+2\delta$, and $\Psi_0+3\delta$ . . . . The same applies to the change of the distance d at each lattice point in the y direction.

The angle may be within a range of −90°<ξ<0°. In the case of −90°<ξ<0° and 0°<ξ<90°, the direction in which the center of gravity G is shifted from the lattice point is a direction different from the x direction and the y direction, so that an additional effect is obtained as described later. When this additional effect is not considered, the direction in which the center of gravity G is shifted from the lattice point may be the x direction or the y direction.

Figure 17:
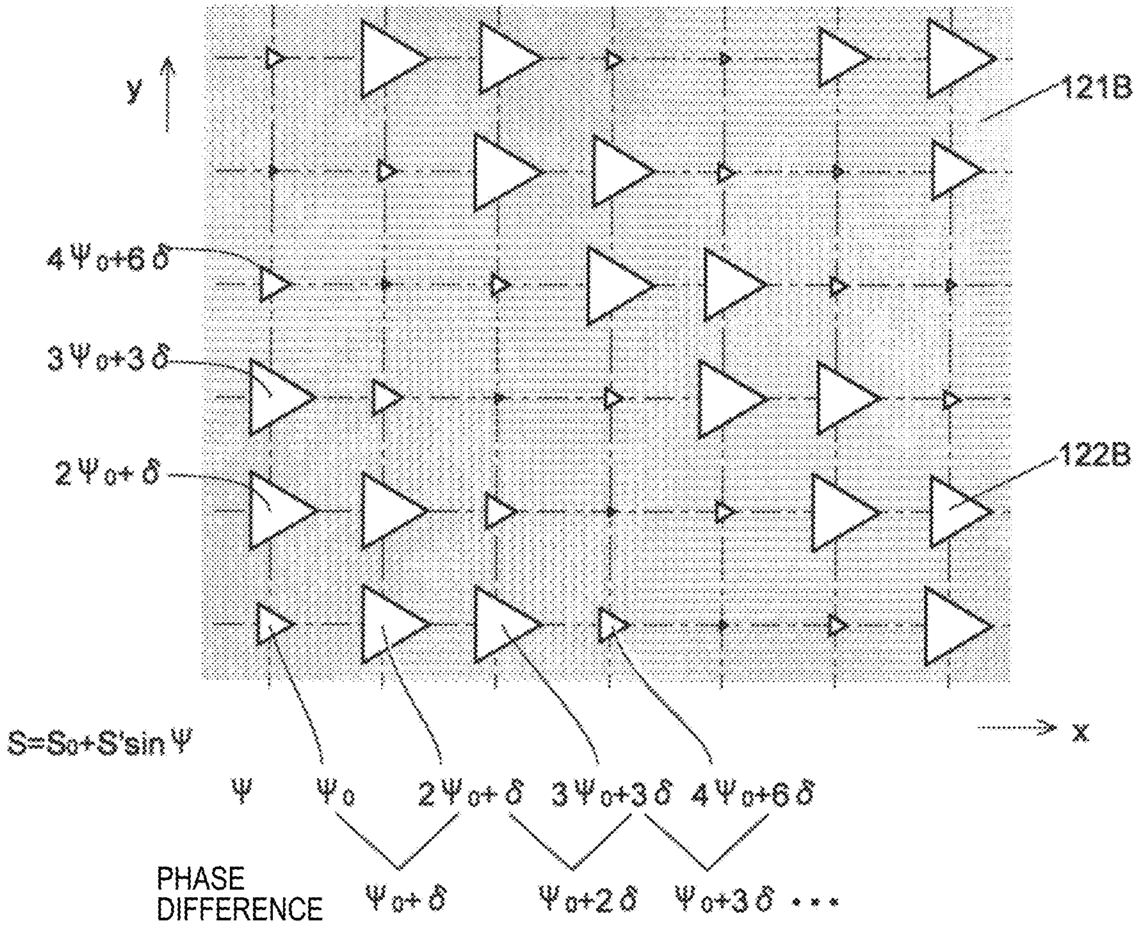
FIG. 17 is a partial plan view illustrating a modification of planar shapes of the modified refractive index regions of the two-dimensional photonic crystal layer in the third embodiment.

FIG. 17 illustrates still another example of the two-dimensional photonic crystal layer 12B. In the two-dimensional photonic crystal layer 12B, the centers of gravity of all the modified refractive index regions 122B are disposed on the lattice points. The planar shapes of the respective modified refractive index regions 122B are similar shapes and have different areas S from each other. The area S periodically changes with a predetermined modulation period in the x direction, and the modulation period gradually decreases. In the example of FIG. 17, the area S of the planar shape of each modified refractive index region 122B at a corresponding one of the lattice points is expressed by $S=S_0+S'\sin\Psi$, and Ψ changes as $\Psi_0$, $2\Psi_0+\delta$, $3\Psi_0+3\delta$, and $4\Psi_0+6\delta$ in the x direction. A phase difference in the change of the area between adjacent lattice points increases as $\Psi_0+\delta$, $\Psi_0+2\delta$, and $\Psi_0+3\delta$ . . . . The same applies to the y direction.

In the three examples described so far, any one of the direction of the positional shift of the center of gravity of the modified refractive index region 122B from the lattice point of the square lattice, the distance of the positional shift, or the area of the modified refractive index region 122B has the decreasing modulation period in the x direction and the y direction. However, similar changes may be formed by combining two and three of these three.

The areas of the first electrode 171 and the second electrode 172 are set such that an electric current is supplied over a range in which the large number of modified refractive index regions 122B having different directions of the positional shift, different distances of the positional shift, or different areas from each other are present in the two-dimensional photonic crystal layer 12B.

Next, an operation of the two-dimensional photonic crystal laser of the third embodiment will be described. By applying a predetermined voltage between the first electrode 171 and the second electrode 172, an electric current is supplied into the active layer 11 from both electrodes. As a result, the active layer 11 emits light having a wavelength within a specific wavelength band according to the material of the active layer 11. The light emission thus generated is introduced over the range in which the large number of modified refractive index regions 122B having different directions of the positional shift, different distances of the positional shift, or different areas from each other are present in the two-dimensional photonic crystal layer 12B, corresponding to the size of a region into which the electric current is supplied. In the two-dimensional photonic crystal layer 12B, light of a resonant wavelength corresponding to the lattice point period a of the square lattice resonates to be selectively amplified, and laser oscillation occurs.

The oscillated laser light is emitted from both surfaces of the two-dimensional photonic crystal layer 12B to the outside of the two-dimensional photonic crystal layer 12B. Among them, the laser light emitted toward the first electrode 171 is reflected by the first electrode 171 and emitted from the window portion 1722 of the second electrode 172 to the outside of the two-dimensional photonic crystal laser 10. The laser light emitted toward the second electrode 172 is directly emitted from the window portion 1722 of the second electrode 172 to the outside of the two-dimensional photonic crystal laser.

An emission angle θ(x, y) that is an angle formed by a laser beam emitted from each point (x, y) on the two-dimensional photonic crystal layer 12B and a normal to the two-dimensional photonic crystal layer 12B, and an azimuthal angle φ(x, y) that is an angle formed by a projection of the laser beam onto the surface of the two-dimensional photonic crystal layer 12B and a reference line parallel to the surface depend on a modulation at a position on the two-dimensional photonic crystal layer 12B from which the laser beam is emitted. The emission angle θ and the azimuthal angle φ are obtained as described below (see Patent Literature 1).

First, a modulation phase Ψ at each lattice point is obtained. The modulation phase Ψ is Ψ that satisfies a relationship of $d=d_{max}\sin\Psi$ ($d_{max}$ is a maximum shift value) when the distance d of the shift from the lattice point is modulated, and is Ψ that satisfies a relationship of $S=S_0+S'\sin\Psi$ ($S_0$ is an average value of the area, and S' is a modulation amplitude of the area) when the area S of the modified refractive index region is modulated. When the modulation phase Ψ described in Patent Literature 1 is applied, it is expressed as $$\Psi = r\uparrow \cdot G'\uparrow$$

by using a reciprocal lattice vector $$G'\uparrow = (g_x', g_y') = (k_x \pm |k\uparrow|(\sin\theta\cos\varphi)/n_{eff},\ k_y \pm |k\uparrow|(\sin\theta\cos\varphi)/n_{eff})$$

expressed using a wave vector $k\uparrow=(k_x, k_y)$ of light of a wavelength $\lambda_L$ in the two-dimensional photonic crystal layer, an effective refractive index $n_{eff}$ of the two-dimensional photonic crystal layer, and an azimuthal angle φ from a predetermined reference line of the two-dimensional lattice, and a position vector $r\uparrow$ of each lattice point.

In the two-dimensional photonic crystal layer 12B in the two-dimensional photonic crystal laser of the third embodiment, the modified refractive index regions 122B are disposed in a square lattice shape. In the case of the square lattice, the position vector $r\uparrow$ is expressed as $r\uparrow=(m_x a, m_y a)$ using integers $m_x$ and $m_y$, the wave vector $k\uparrow$ is expressed as $k\uparrow=(\pi/a, \pi/a)$, and the reciprocal lattice vector $$G' = (g_x', g_y')$$

is expressed as

[Expression 11]

$$g_x' = \left(\frac{1}{2} \pm \frac{1}{\sqrt{2}\,n_{eff}}\sin\theta\cos\phi\right)\cdot\frac{2\pi}{a} \tag{16}$$

$$g_y' = \left(\frac{1}{2} \pm \frac{1}{\sqrt{2}\,n_{eff}}\sin\theta\sin\phi\right)\cdot\frac{2\pi}{a}.$$

As a result, the modulation phase Ψ of each lattice point is expressed as

[Expression 12]

$$\Psi = 2\pi\left[\left(\frac{1}{2} \pm \frac{1}{\sqrt{2}\,n_{eff}}\sin\theta\cos\phi\right)m_x + \left(\frac{1}{2} \pm \frac{1}{\sqrt{2}\,n_{eff}}\sin\theta\sin\phi\right)m_y\right]. \tag{17}$$

From Expression (17), a difference in the modulation phase Ψ between two lattice points $(na, m_y a)$ and $((n+1)a, m_y a)$ adjacent in the x direction ($m_y$ may be any value as long as the two lattice points have the same value) depends on sin θ. The same applies to a difference in the modulation phase Ψ between two lattice points adjacent in the y direction. Therefore, when the modulation phase Ψ is set such that the value of θ increases within a range of 0 to 90° along with movement in either positive or negative direction in each of the x direction and the y direction in the two-dimensional photonic crystal layer 12B, the difference in the modulation phase Ψ between the adjacent lattice points increases. This corresponds to the decrease in the modulation period. As a result, the emission angle θ of the laser beam is set so as to increase as the emission position from the two-dimensional photonic crystal layer 12B moves in the one direction. Laser beams having such different emission angles θ are emitted in a bunch to the outside of the two-dimensional photonic crystal laser, so that an object can be irradiated with laser light over a wide range.

Here, the case of the square lattice has been described as an example, but the same applies to a case of a rectangular lattice or a triangular lattice.

Although the modulation phase Ψ described in Patent Literature 1 has been used for description so far, a more precise modulation phase Ψ can be obtained by using a method described in Patent Literature 2. According to this method, in the case where the two-dimensional lattice is a square lattice, each of components of a reciprocal lattice vector $G'(x, y)\uparrow$ is

[Expression 13]

$$g_x'(x) = \pm\left(\frac{1}{2} \pm \frac{\sin\theta_x(x)}{\sqrt{2}\,n_{eff}}\right)\cdot\frac{2\pi}{a} \tag{18}$$

$$g_y'(y) = \pm\left(\frac{1}{2} \pm \frac{\sin\theta_y(y)}{\sqrt{2}\,n_{eff}}\right)\cdot\frac{2\pi}{a}.$$

A modulation phase Ψ(x, y) for each position (x, y) is expressed by Expression (6) described above. In the third embodiment, the modulation phase Ψ(x, y) at each lattice point may be obtained using Expression (6).

Figure 18A:
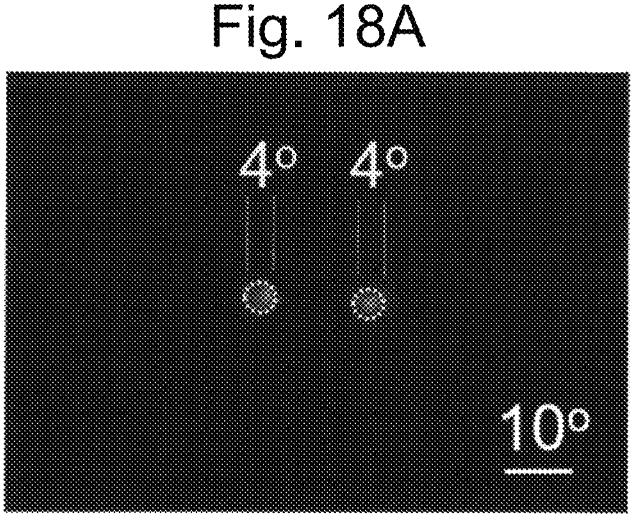
FIGS. 18A and 18B are photographs obtained by photographing cross-sections of laser beams emitted from the two-dimensional photonic crystal laser of the third embodiment.
Figure 18B:
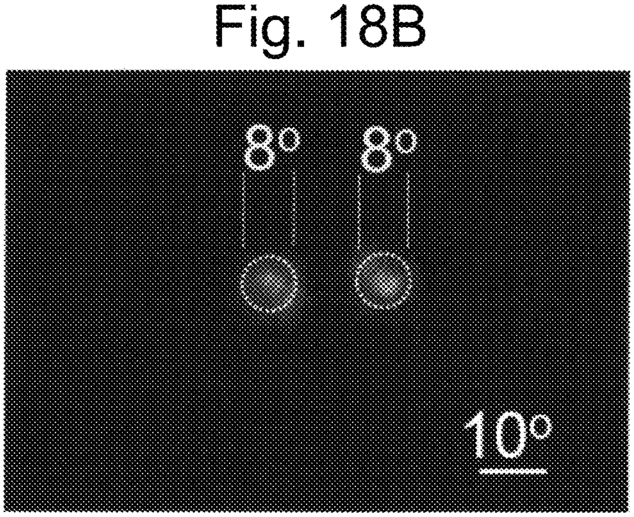
Figure 18C:
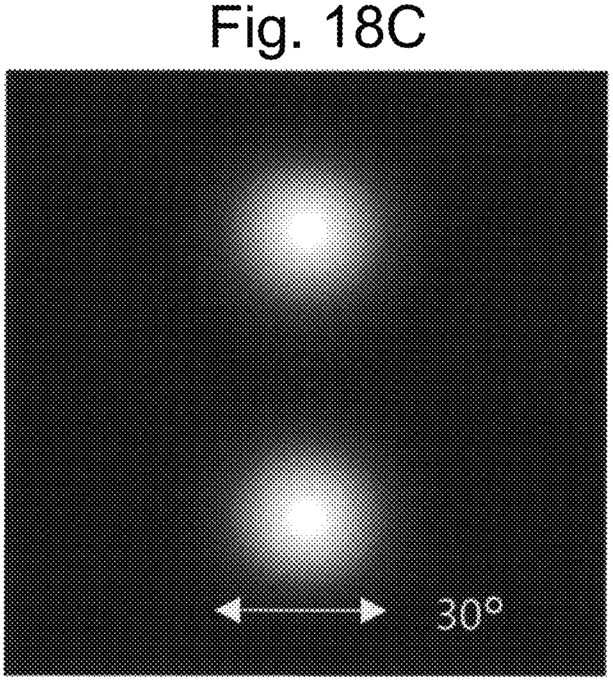
FIG. 18C is a drawing obtained by calculation of the cross sections.
Figure 19:
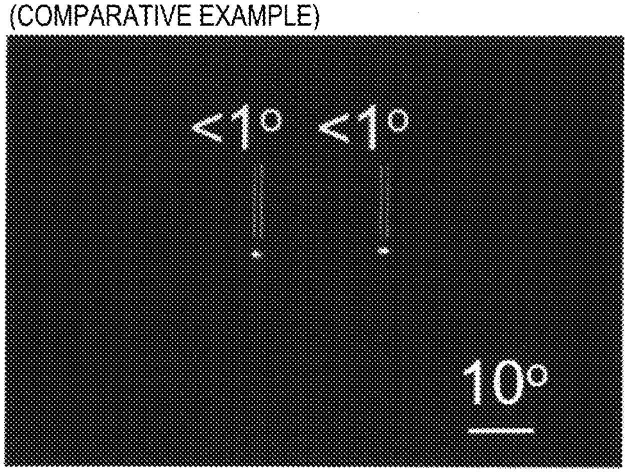
FIG. 19 is a photograph obtained by photographing cross-sections of laser beams emitted from a two-dimensional photonic crystal laser of a comparative example.

FIGS. 18A and 18B illustrate cross-sections of laser beams emitted from the two-dimensional photonic crystal laser of the third embodiment. In FIGS. 18A and 18B, a two-dimensional photonic crystal laser is produced in which the modulation is set such that the emission angle θ changes within a range of ±2° (4° in total, in the case of FIG. 18A) or ±4° (8° in total, in the case of FIG. 18B) from 10° in the two-dimensional photonic crystal layer 12B, and the cross-sections of the emitted laser beams are photographed. In FIG. 18C, for a two-dimensional photonic crystal laser in which the modulation is set such that the emission angle θ changes within a range of ±15° (300 in total) from 25° in the two-dimensional photonic crystal layer 12B, cross-sections of laser beams are obtained by calculation. For comparison, FIG. 19 shows a photograph obtained by photographing cross-sections of laser beams emitted from the entire two-dimensional photonic crystal layer 12 at an emission angle θ of 10°, in a two-dimensional photonic crystal laser similar to that described in Patent Literature 2. In each case, two laser beams having azimuthal angles different from each other by 180° are emitted. It can be seen that the range in which the beam is emitted is wider in the third embodiment illustrated in FIGS. 18A to 18C than in a comparative example illustrated in FIG. 19.

The example of expanding the diameter of the laser beam by changing the modulation period depending on the position in the two-dimensional photonic crystal layer 12B has been described so far. However, in a case where the direction in which the position of the center of gravity of the modified refractive index region is shifted from the lattice point is inclined from the direction in which the lattice points are disposed with a predetermined lattice point period, a laser beam having a single resonant mode and single-polarized light can be emitted regardless of whether or not the modulation period is changed (in the example illustrated in FIG. 16, the modulation period is changed).

Figure 20:
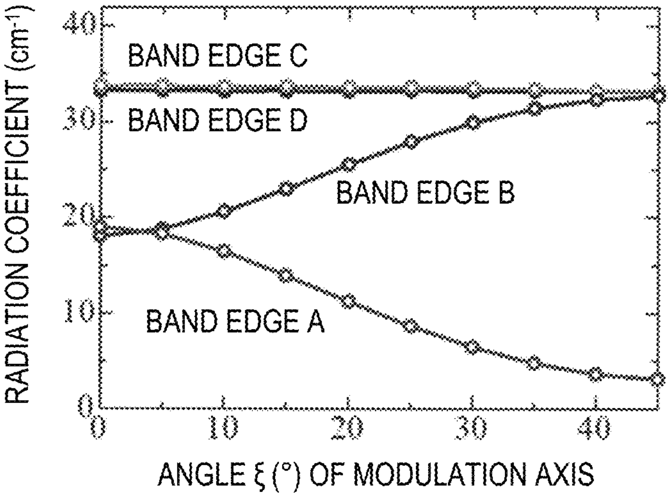
FIG. 20 is a graph illustrating a result of calculating a difference in radiation coefficient by an angle ξ for each band in a modification of the third embodiment.
Figure 21A:
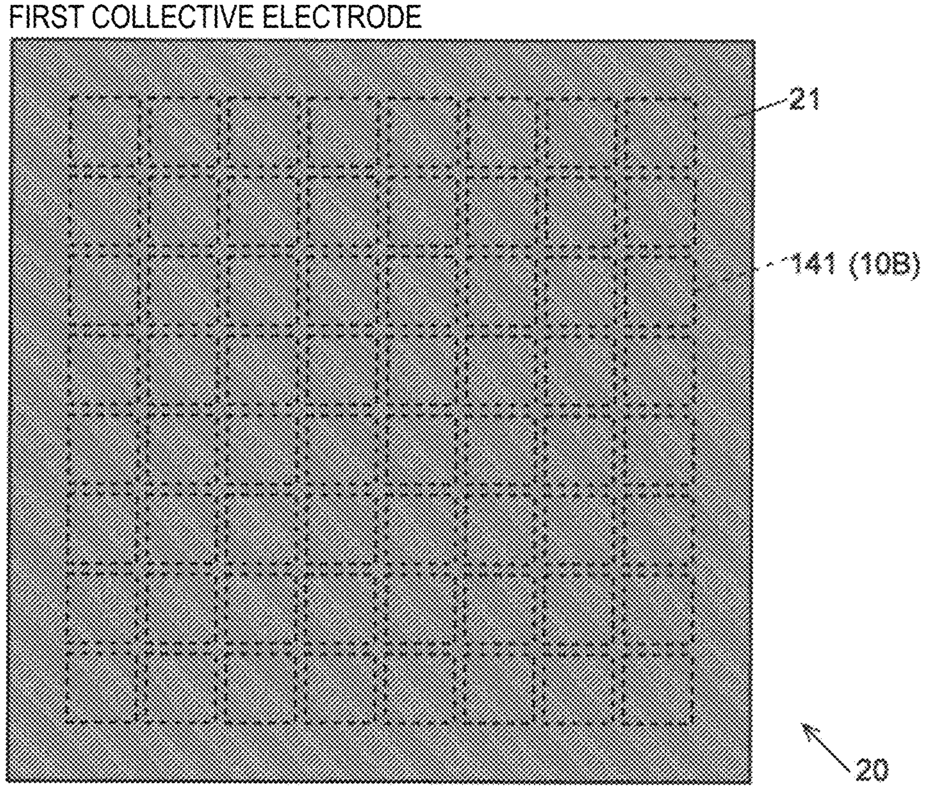
FIGS. 21A and 21B are plan views of a two-dimensional photonic crystal laser array according to a fourth embodiment as viewed from a first collective electrode side and a second collective electrode side, respectively.
Figure 21B:
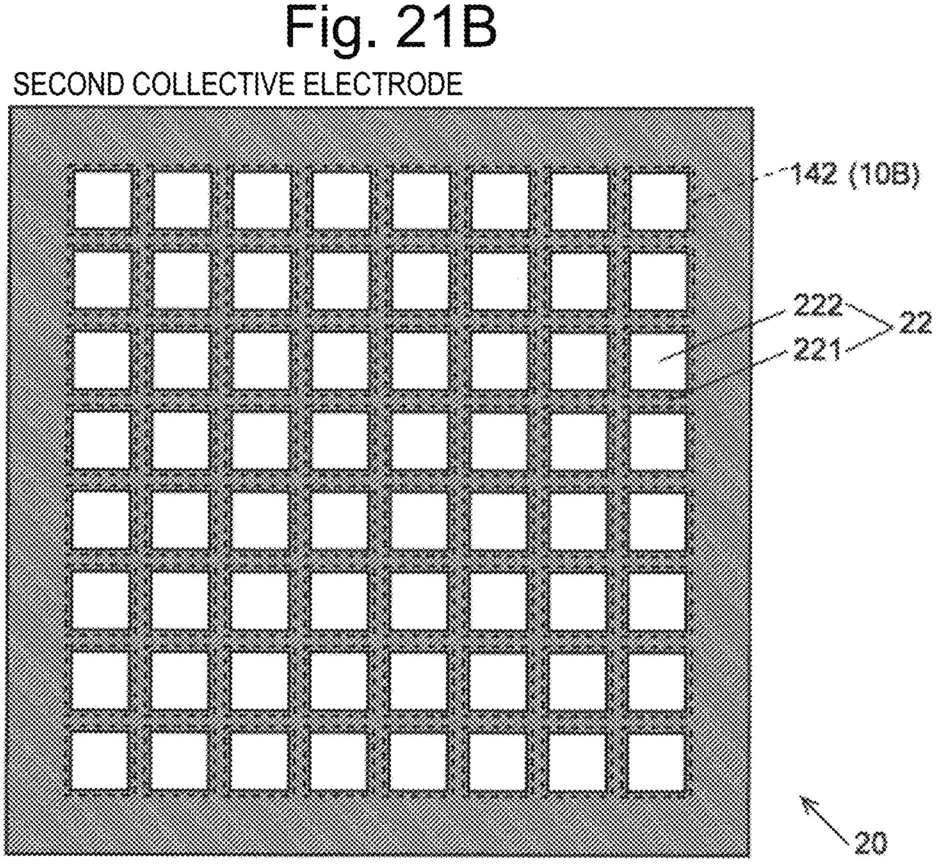

FIG. 20 illustrates results of calculating a radiation coefficient in each of a plurality of photonic bands of a two-dimensional photonic crystal, for a plurality of examples in which the distance between the lattice point of the square lattice and the center of gravity of the modified refractive index region and the area of the modified refractive index region are modulated (the modulation period is not changed) at each lattice point, and the inclination of the straight line connecting the lattice point and the center of gravity with respect to one of the directions in which the lattice points are disposed with the lattice point period a has different angles ξ. Here, the radiation coefficient refers to a ratio of light radiated by diffraction while being guided through a unit length to light existing as a waveguide mode in the two-dimensional photonic crystal layer. As the radiation coefficient is smaller, light is more easily confined in the two-dimensional photonic crystal layer, so that laser oscillation is more likely to occur.

As can be seen from FIG. 20, when the angle ξ is other than 0°, a band edge A among the plurality of photonic bands has the smallest radiation coefficient. In addition, as the angle ξ is increased from 0°, a difference between the radiation coefficient of the band edge A and the radiation coefficient of a band edge B having the second smallest radiation coefficient increases. These results show that as the angle ξ is larger, laser oscillation by the band edge A alone is more likely to occur. As a result, the laser beam having a single resonant mode and single-polarized light can be emitted.

(4) Fourth Embodiment (Two-Dimensional Photonic Crystal Laser Array)

Next, as the fourth embodiment, an embodiment of a two-dimensional photonic crystal laser array will be described. This two-dimensional photonic crystal laser array 20 includes a plurality of the two-dimensional photonic crystal layers of the third embodiment. However, as described later, the shapes of the first electrode 171 and the second electrode 172 are different from those of the third embodiment. In the plan views of FIGS. 21A and 21B, a broken line indicates each of the two-dimensional photonic crystal lasers (denoted by reference numeral "10B" in FIGS. 21A and 21B). The modulation in the two-dimensional photonic crystal layer 12B is different in each two-dimensional photonic crystal laser 10B, so that the laser beams emitted from the respective two-dimensional photonic crystal lasers 10B also have different ranges of emission angles.

The two-dimensional photonic crystal laser array 20 further includes a first collective electrode 21 including a square conductor flat plate, and a second collective electrode 22 that is a mesh electrode in which a plurality of holes 222 are formed in a square conductor flat plate 221. The first collective electrode 21, the second collective electrode 22, and a power supply (not illustrated) constitute the electric current supply part. Each of the two-dimensional photonic crystal lasers 10B is provided so as to close one of the holes 222 of the second collective electrode 22. The substrate 16 is in contact with a portion of the flat plate 221 around the hole 222. In addition, the first cladding layer 141 of each of the two-dimensional photonic crystal lasers 10B is in contact with the first collective electrode 21. Therefore, in each of the two-dimensional photonic crystal lasers 10B, the first collective electrode 21 and the second collective electrode 22 serve as the first electrode and the second electrode. The first electrode and the second electrode may be separately provided in each of the two-dimensional photonic crystal lasers 10B, and each first electrode and the first collective electrode 21, and each second electrode and the second collective electrode 22 may be connected together.

In the two-dimensional photonic crystal laser array 20 of the fourth embodiment, when an electric current flows between the first collective electrode 21 and the second collective electrode 22 from the power supply (not illustrated), the electric current is supplied to each of the two-dimensional photonic crystal lasers 10B. As a result, a laser beam is generated that spreads at a different emission angle for each two-dimensional photonic crystal laser 10B. The generated laser beams are emitted to the outside through the holes 222 of the second collective electrode 22. As a result, it is possible to irradiate a wider range with laser light having a nearly uniform intensity than in the case of using the single two-dimensional photonic crystal laser 10B.

Figure 22:
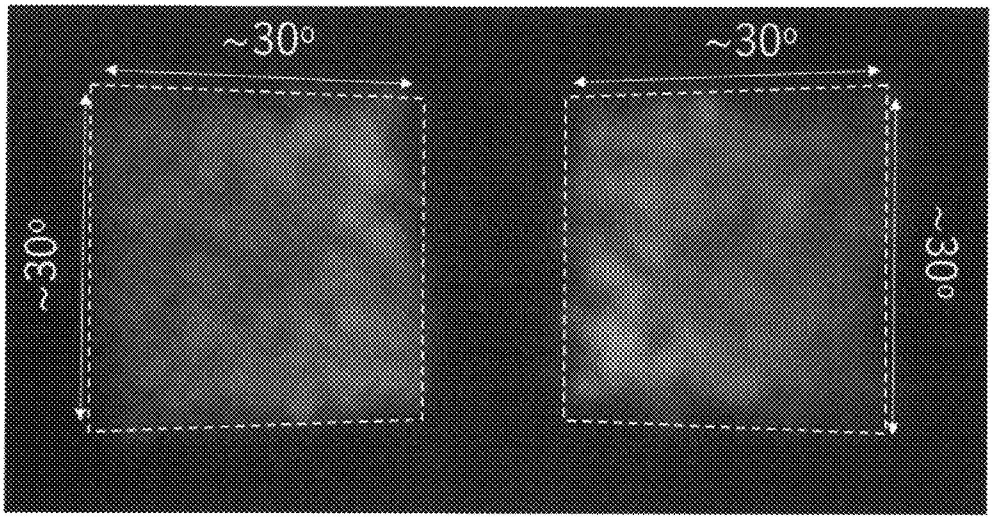
FIG. 22 is a photograph obtained by photographing cross-sections of laser beams emitted from the two-dimensional photonic crystal laser array of the fourth embodiment.
Figure 23A:
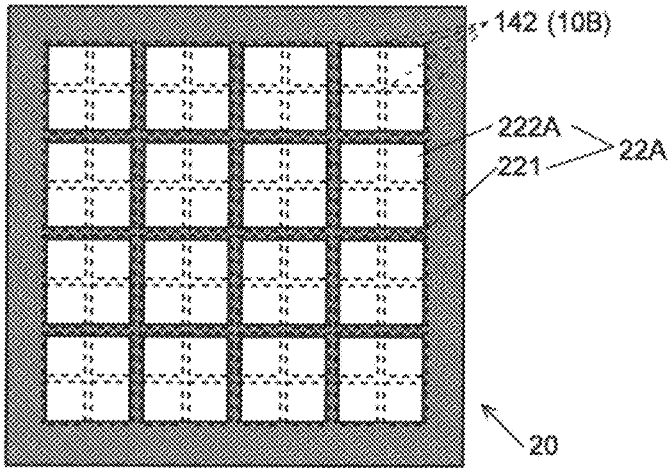
FIGS. 23A and 23B are drawings illustrating two modifications of the second collective electrode in the two-dimensional photonic crystal laser array of the fourth embodiment.
Figure 23B:
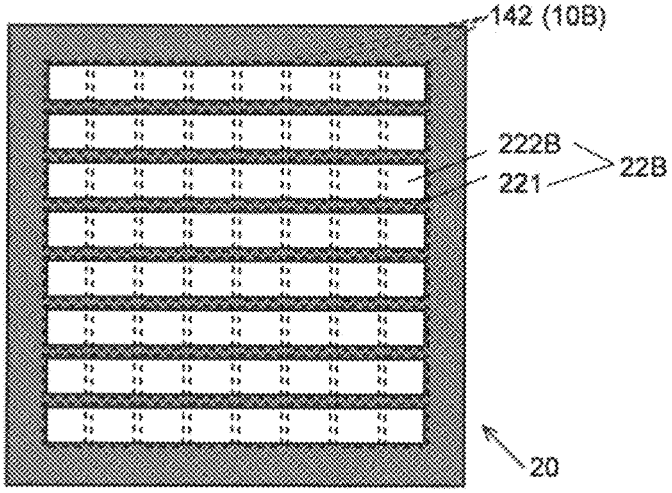

FIG. 22 illustrates a photograph obtained by photographing cross-sections of laser beams emitted from the two-dimensional photonic crystal laser array 20 of the present embodiment. A laser beam having an emission angle θ spreading within a range of ±15° (30° in total) from 100 is obtained. The spread of this laser beam is wider than the laser beam emitted from the single two-dimensional photonic crystal laser 10B.

The shapes of the first collective electrode 21 and the second collective electrode 22 are not limited to those described above. For example, the first collective electrode 21 may be a circular flat plate, and the second collective electrode 22 may be a circular flat plate provided with a large number of holes. In addition, in the example illustrated in FIG. 21B, one two-dimensional photonic crystal laser 10B is disposed in one hole 222 of the second collective electrode 22. However, as in a second collective electrode 22A illustrated in FIG. 23A, a plurality of (four in the example of FIG. 23A) two-dimensional photonic crystal lasers 10B may be disposed in one hole 222A. Furthermore, although the holes 222 are two-dimensionally disposed in the second collective electrode 22 in the example illustrated in FIG. 21B, holes 222B may be one-dimensionally disposed as in a second collective electrode 22B illustrated in FIG. 23B. In this case, it is preferable that the hole 222B has a long line shape (slit shape) in a direction perpendicular to a disposition direction of the holes 222B.

Figure 24A:
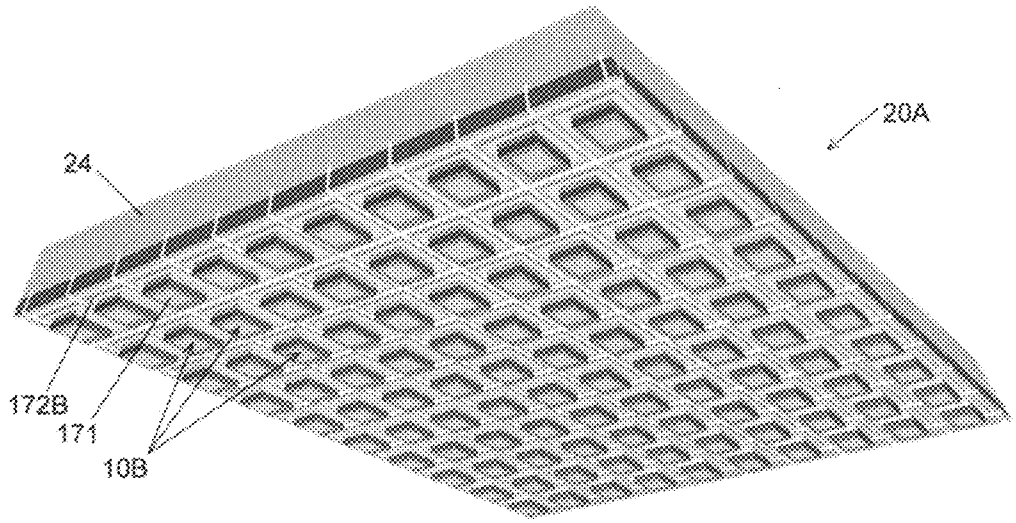
FIG. 24A is a schematic perspective view.
Figure 24B:
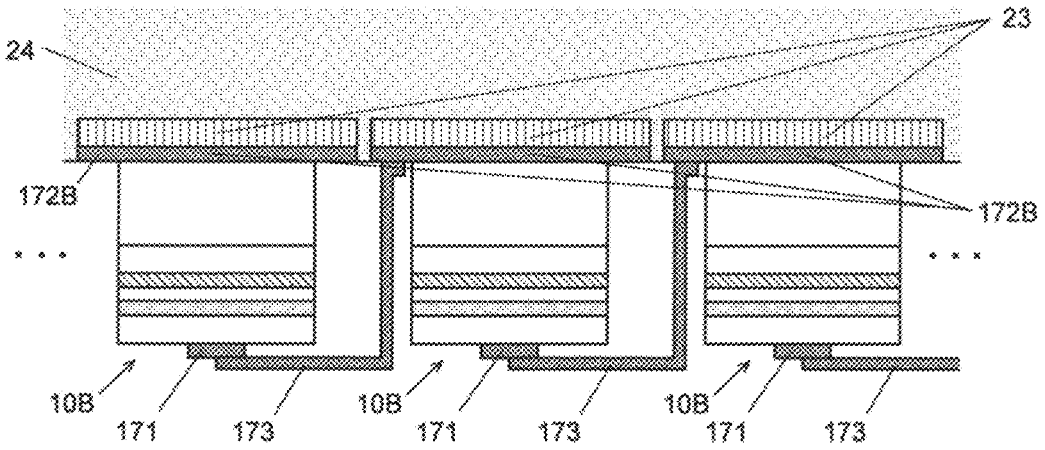
FIG. 24B is a partially enlarged cross-sectional view.
Figure 24C:
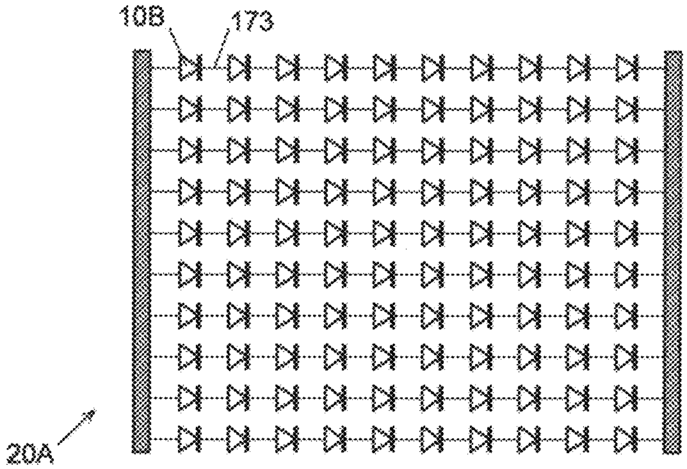
FIG. 24C is a circuit diagram illustrating another modification of the two-dimensional photonic crystal laser array of the fourth embodiment.

FIGS. 24A, 24B, and 24C illustrate a two-dimensional photonic crystal laser array 20A of a modification. In this two-dimensional photonic crystal laser array 20A, 100 two-dimensional photonic crystal lasers 10B are disposed side by side in 10 rows×10 columns, and the two-dimensional photonic crystal lasers 10B are insulated from each other by an insulating layer 24 made of i-type GaAs which is an intrinsic semiconductor. A cover layer 23 made of n-type GaAs which is an n-type semiconductor is provided on an outer side of a second electrode 172B of each of the two-dimensional photonic crystal lasers 10B. The insulating layer 24 is formed integrally with a portion between the two-dimensional photonic crystal lasers 10B on outer sides of the cover layers 23. The n-type GaAs and the i-type GaAs are materials capable of transmitting laser light generated from the two-dimensional photonic crystal laser 10B.

In 10 two-dimensional photonic crystal lasers 10B disposed in the row direction among the two-dimensional photonic crystal lasers 10B, a conductive connection member 173 electrically connects the first electrode 171 to the second electrode 172B of the two-dimensional photonic crystal laser 10B adjacent on one side, and connects the second electrode 172B to the first electrode 171 of the two-dimensional photonic crystal laser 10B adjacent on the other side. As a result, as illustrated in FIG. 24C, the 10 two-dimensional photonic crystal lasers 10B disposed in the row direction are connected in series. On the other hand, in the column direction, any two-dimensional photonic crystal laser 10B is electrically insulated from the adjacent two-dimensional photonic crystal laser 10B. In FIG. 24A, the connection member 173 is not illustrated. In addition, in order to secure a connection portion with the connection member 173, the second electrode 172B is formed to extend outward in a two-dimensional face as compared with the second electrode 172 illustrated in FIG. 1A.

Figure 25:
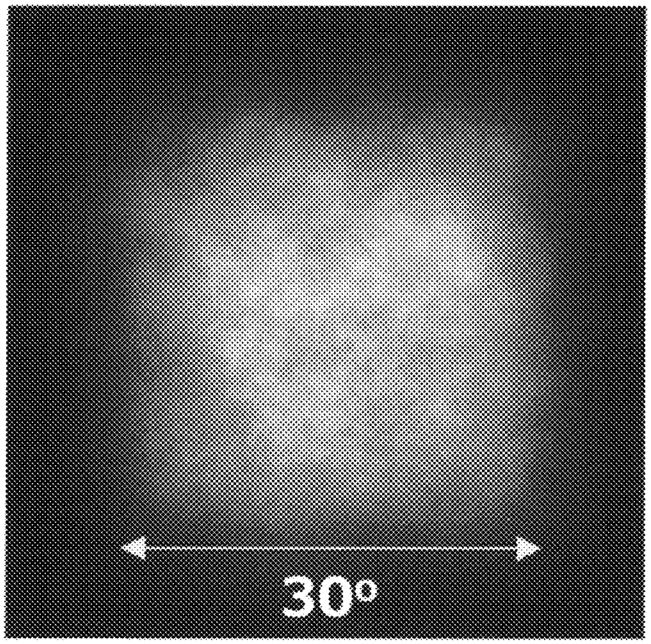
FIG. 25 is a drawing illustrating a result obtained by experiment of a far-field image of a laser beam emitted from the two-dimensional photonic crystal laser array of the modification illustrated in FIGS. 24A, 24B and 24C.
Figure 26:
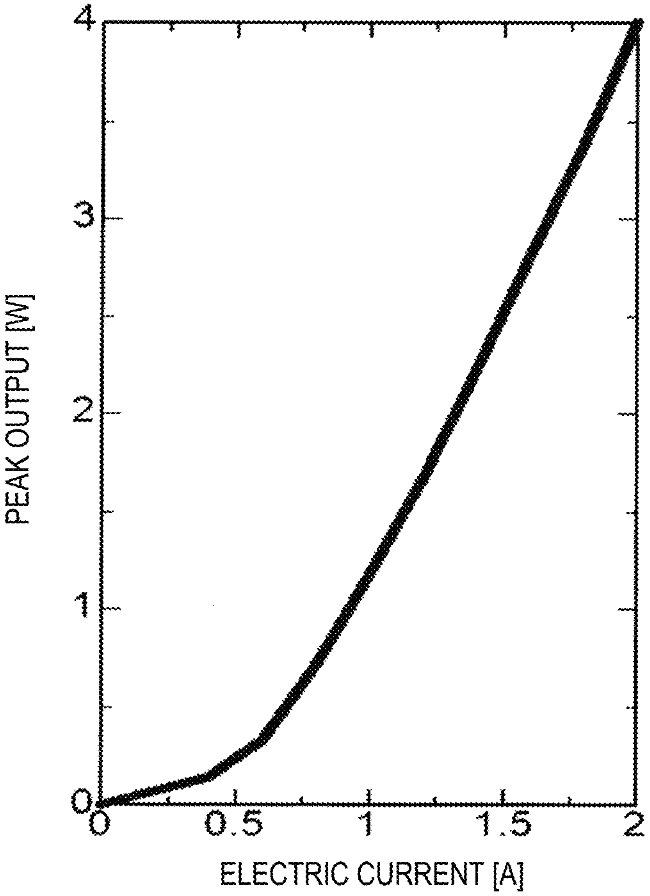
FIG. 26 is a graph illustrating electric current-output characteristics of the laser beam emitted from the two-dimensional photonic crystal laser array of the modification illustrated in FIGS. 24A, 24B, and 24C.
Figure 27:
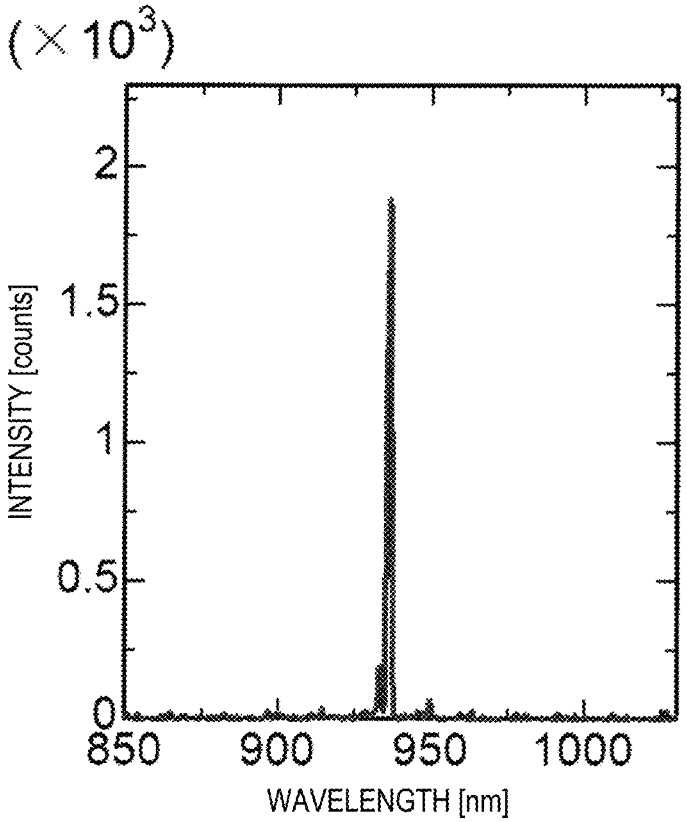
FIG. 27 is a graph illustrating an oscillation spectrum of the laser beam emitted from the two-dimensional photonic crystal laser array of the modification illustrated in FIGS. 24A, 24B, and 24C.

FIG. 25 illustrates a photograph obtained by photographing a cross-section of a laser beam emitted from the two-dimensional photonic crystal laser array 20A of the modification. Although two laser beams having azimuthal angles different from each other by 180° are emitted from the two-dimensional photonic crystal laser array 20A, FIG. 25 illustrates only one of them. From FIG. 25, it can be said that the intensity is larger and the uniformity of the intensity at each position is higher than those of the laser beams (FIG. 22) emitted from the two-dimensional photonic crystal laser array 20 described above. FIGS. 26 and 27 illustrate electric current-output characteristics and an oscillation spectrum of the laser beam emitted from the two-dimensional photonic crystal laser array 20A of the modification, respectively. In both cases, sufficient characteristics as a laser are obtained.

(5) Fifth Embodiment (Wide Cross-Sectional Area Laser of Second Mode)

Next, an embodiment of a two-dimensional photonic crystal laser of a second mode will be described. As a premise, the example of the two-dimensional photonic crystal laser of the third embodiment including the two-dimensional photonic crystal layer 12B having the structure illustrated in FIG. 16 in which the two-dimensional photonic crystal layer has the basic modulation state (the shift amount or/and the area in the present invention is/are not adjusted from the basic modulation state) is studied. In this example, the distance d of the shift of the center of gravity G from the lattice point periodically changes with the predetermined modulation period in the x direction, and the modulation period gradually decreases. Specifically, the distance d at each lattice point changes as $d_{max}\sin\Psi_0$, $d_{max}\sin(2\Psi_0+6)$, $d_{max}\sin(3\Psi_0+3\delta)$, $d_{max}\sin(4\Psi_0+6\delta)$ . . . in the positive direction in each of the x direction and the y direction, and the phase difference in the change of the distance between adjacent lattice points increases as $\Psi_0+\delta$, $\Psi_0+2\delta$, and $\Psi_0+3\delta$ . . . . This modulation phase is in the basic modulation state continuously increasing in the positive x direction and the positive y direction.

The two-dimensional photonic crystal laser having the two-dimensional photonic crystal layer in such a basic modulation state emits two wide cross-sectional area laser beams having azimuthal angles different from each other by 180° as illustrated in the calculation result of the far-field image in FIG. 18C. In the example illustrated in FIG. 18C, the wide cross-sectional area laser beam spreads within the range of the inclination angle of 30°(±15°). The cross-section of the obtained wide cross-sectional area laser beam has a circular shape, and the intensity decreases with increasing distance from the center of this circle.

Hence, as a wide cross-sectional area laser beam having a more uniform intensity distribution, a virtual wide cross-sectional area laser beam having a far phase distribution obtained from the two-dimensional photonic crystal layer in the third embodiment is considered. The virtual wide cross-sectional area laser beam has a square cross-section in which the inclination angle spreads at 30° in the x direction and at 30° in the y direction, has a uniform intensity distributed in the cross-section, and is in the basic modulation state. A target far electric field distribution $E_{far\_iFFT}(K\uparrow)$, which is an electric field distribution at a position sufficiently separated from the two-dimensional photonic crystal layer 12B, in the virtual wide cross-sectional area laser beam is set as a model. By performing an inverse Fourier transform on the target far electric field distribution $E_{far\_iFFT}(K\uparrow)$ by using Expression (8) described above, a target radiated electric field distribution $E_{rad\_iFFT}(r\uparrow)$, which is an electric field distribution radiated from each position (at each position) in the two-dimensional photonic crystal layer 12B, is obtained by calculation. Moreover, a modulation phase $\Psi(r\uparrow)$ at each lattice point is adjusted such that a radiated electric field distribution $E_{rad}(r\uparrow)$ radiated from the two-dimensional photonic crystal layer 12B becomes closer to the target radiated electric field distribution $E_{rad\_iFFT}(r\uparrow)$. In the present embodiment, the modulation phase $\Psi(r\uparrow)$ at each lattice point rt=(x, y) is determined using Expression (9) described above.

An operation is repeatedly executed in which after the radiated electric field distribution $E_{rad}(r\uparrow)$ radiated from each position in the two-dimensional photonic crystal layer 12B after the adjustment is obtained, a far electric field distribution $E_{far}(r\uparrow)$ is obtained by Expression (7) described above by using this radiated electric field distribution $E_{rad}(r\uparrow)$, a phase distribution of the electric field in the target far electric field distribution $E_{far\_iFFT}(K\uparrow)$ is updated by applying a phase distribution of the electric field in the obtained far electric field distribution $E_{far}(r\uparrow)$, and the modulation phase $\Psi(r\uparrow)$ is adjusted such that the radiated electric field distribution $E_{rad}(r\uparrow)$ becomes closer to the target radiated electric field distribution $E_{rad\_iFFT}(r\uparrow)$.

Figure 28:
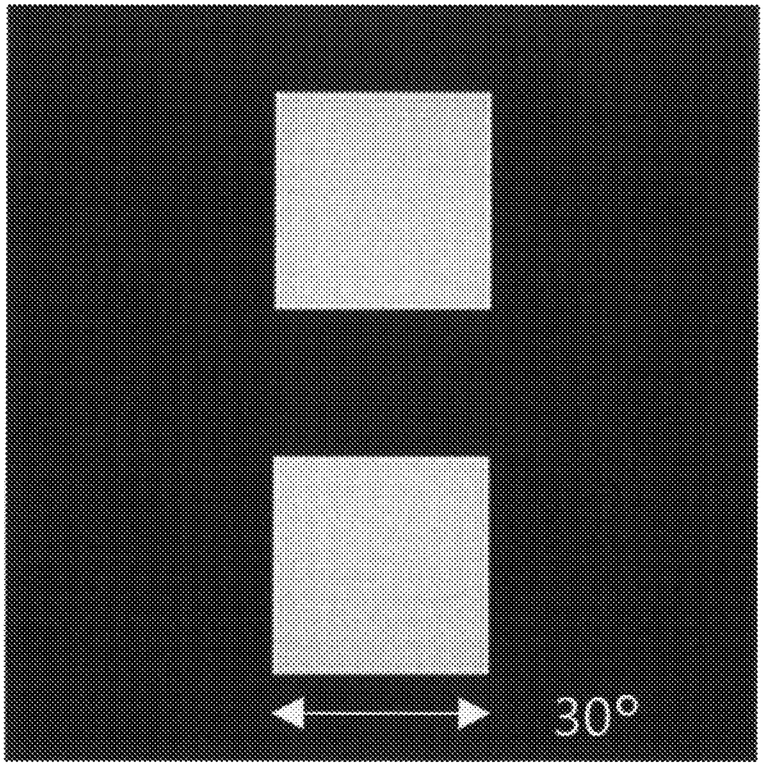
FIG. 28 is a drawing illustrating a result obtained by calculation of a far-field image of laser beams emitted from a two-dimensional photonic crystal laser of a fifth embodiment obtained by improving the two-dimensional photonic crystal laser of the third embodiment.
Figure 29:
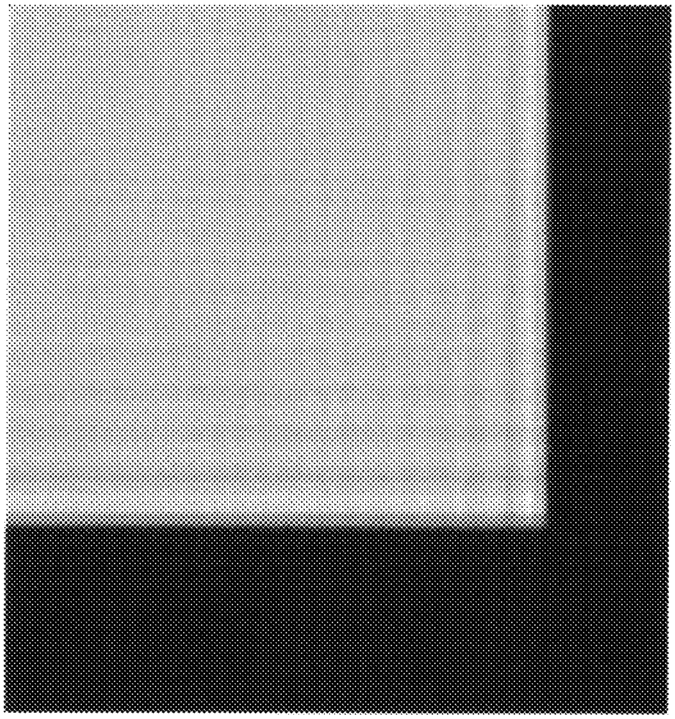
FIG. 29 is a partially enlarged view of the far-field image of the laser beam illustrated in FIG. 28.
Figure 30:
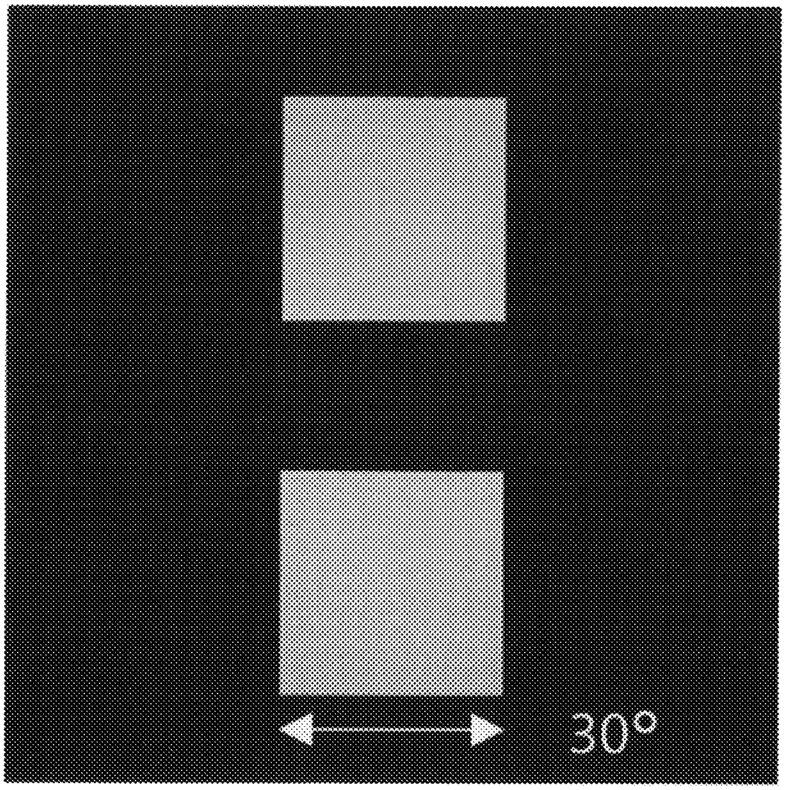
FIG. 30 is a drawing illustrating a result obtained by calculation of a far-field image of laser beams emitted from a two-dimensional photonic crystal laser obtained by improving the two-dimensional photonic crystal laser for which the calculation of FIG. 28 is performed.

FIG. 28 illustrates a calculation result of a far-field image of the wide cross-sectional area beams emitted from the two-dimensional photonic crystal layer 12B after the modulation phase $\Psi(r\uparrow)$ is adjusted once (operation up to the end of the previous paragraph). In addition, FIG. 29 is an enlarged view of a lower right portion of the lower one of the two wide cross-sectional area beams illustrated in FIG. 28. As can be seen from FIG. 28, the cross-sectional shape of the wide cross-sectional area beam is a square similar to the virtual wide cross-sectional area beam described above. However, as can be seen from the enlarged view illustrated in FIG. 29, a periodic pattern considered to be due to interference is seen in the intensity distribution. FIG. 30 illustrates a calculation result of a far-field image of the wide cross-sectional area beams after the above-described repetitive operation is executed 20 times. As can been seen from FIG. 30, the pattern is improved as compared with that in FIGS. 28 and 29, and the intensity of the laser light is substantially uniform in the square cross-section.

The present invention is not limited to the above embodiments, and various variations are possible.

Figure 31A:
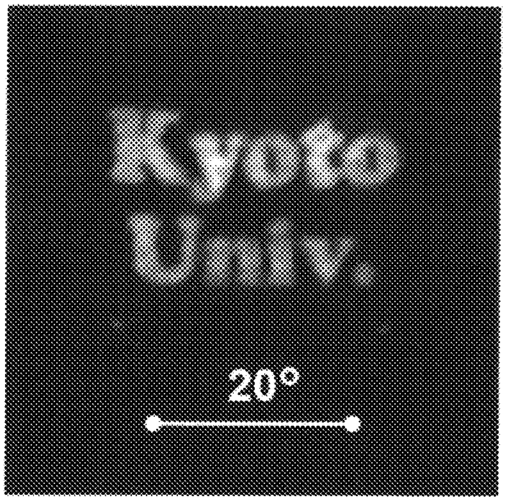
FIGS. 31A, 31B, and 31C are photographs showing examples in which characters and figures are displayed using a two-dimensional photonic crystal laser produced by applying the first embodiment.
Figure 31B:
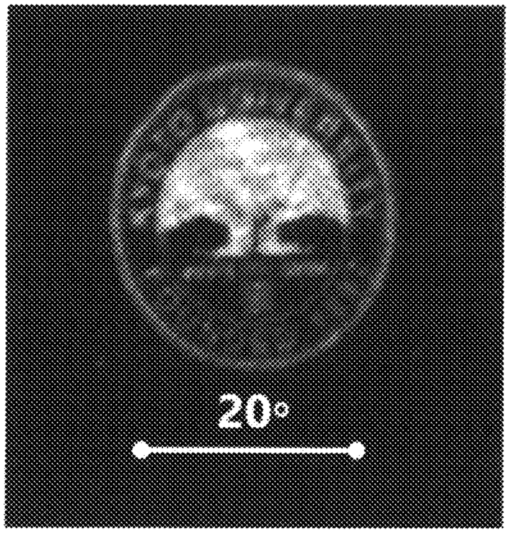
Figure 31C:
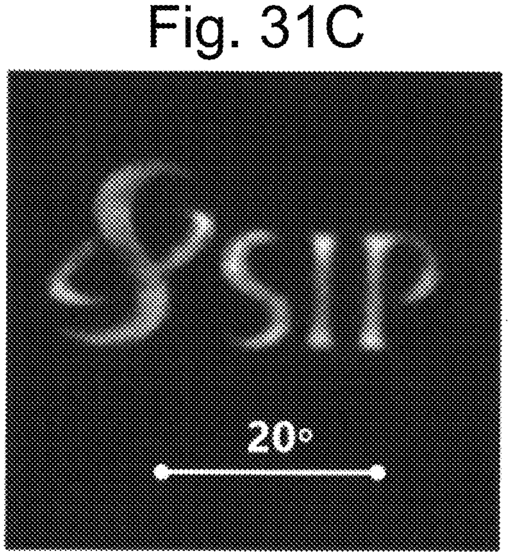

For example, in the examples illustrated in FIGS. 6 to 8, the spots of 100 laser beams are formed so as to be disposed at substantially equal intervals lengthwise and crosswise. However, the number of laser beams and the spot disposition can be appropriately changed by appropriately changing the number of modulation periods to be superposed and the magnitude of each modulation period. In addition, in the examples illustrated in FIGS. 29 and 30, the wide cross-sectional area beam having a uniform intensity and having a square shape with the inclination angle spreading within the angle range of 30° in the x direction and 30° in the y direction is formed. However, the shape and the number of wide cross-sectional area beams can be appropriately changed by appropriately changing the modulation phase of the two-dimensional photonic crystal. By applying these methods, it is possible to display characters, marks, and the like by changing the spot disposition. FIGS. 31A to 31C illustrate examples in which such characters, marks, and the like are displayed.

In the two-dimensional photonic crystal laser array of the fourth embodiment, the plurality of two-dimensional photonic crystal lasers of the third embodiment are used, but instead, a plurality of the two-dimensional photonic crystal lasers of the first, second, or fifth embodiment may be used. In addition, the two-dimensional photonic crystal laser array may be configured using a plurality of the two-dimensional photonic crystal lasers of a plurality of embodiments among the first to third and fifth embodiments.

REFERENCE SIGNS LIST

10, 10B . . . Two-Dimensional Photonic Crystal Laser
11 . . . Active Layer
12, 12A, 12B . . . Two-Dimensional Photonic Crystal Layer
121, 121A . . . Base Member
122, 122A, 122B . . . Modified Refractive Index Region
123 . . . Second Modified Refractive Index Region
1251 . . . First Lattice Point
1252 . . . Second Lattice Point
13 . . . Spacer Layer
141 . . . First Cladding Layer
142 . . . Second Cladding Layer
16 . . . Substrate
171, 171A . . . First Electrode
172, 172A, 172B . . . Second Electrode
1721, 1721A . . . Frame Portion of Second Electrode
1722, 1722A . . . Window Portion of Second Electrode
173 . . . Connection Member
20, 20A . . . Two-Dimensional Photonic Crystal Laser Array
21 . . . First Collective Electrode
22, 22A, 22B . . . Second Collective Electrode
221 . . . Flat Plate of Second Collective Electrode
222, 222A, 222B . . . Hole of Second Collective Electrode
23 . . . Cover Layer
24 . . . Insulating Layer

The invention claimed is:

1. A two-dimensional photonic crystal laser comprising:
a) a pair of electrodes;
b) an active layer provided between the pair of electrodes and configured to generate light of a predetermined wavelength upon being supplied with an electric current from the electrodes; and
c) a two-dimensional photonic crystal layer provided between any one of the pair of electrodes and the active layer and including a plate-shaped base member and a plurality of modified refractive index regions disposed in the base member and having a refractive index different from a refractive index of the base member, wherein
the plurality of modified refractive index regions are disposed to be shifted by different shift amounts from respective lattice points of a two-dimensional lattice which are periodically disposed in the base member with a period corresponding to the predetermined wavelength, or/and are disposed at the respective lattice points with different areas,
the shift amount or/and the area of each of the plurality of modified refractive index regions is/are modified with a composite modulation period in which a plurality of periods different from each other are superposed on each other, and is/are expressed by a modulation phase Ψ'(r↑) expressed using a vector r↑ indicating a position of each of the lattice points of the two-dimensional lattice, a vector $k_n$↑ indicating a combination of an inclination angle and an azimuthal angle of each of n (n is an integer of 2 or more) laser beams differing in the inclination angle and/or the azimuthal angle from each other, and an amplitude $A_n$ and a phase $\exp(i\alpha_n)$ determined for each n as

[Expression 1]

$$\Psi(r\uparrow) = \arg\left[\int\int\sum_n A_n \exp(i\alpha_n)\delta(k\uparrow - k_n\uparrow)\exp(ik\uparrow \cdot r\uparrow)dk\uparrow\right], \quad (1)$$

and
the amplitude $A_n$ and/or the phase $\exp(i\alpha_n)$ for each value of n differ(s) from each other in at least two different values of n.

2. The two-dimensional photonic crystal laser according to claim 1, wherein a correction coefficient is added to the modulation phase Ψ(r↑).

3. The two-dimensional photonic crystal laser according to claim 1, wherein the phase exp (in) is randomly set for each value of n.

4. The two-dimensional photonic crystal laser according to claim 3, wherein the amplitude $A_n$ has a different value for each term having a different value of n.

5. The two-dimensional photonic crystal laser according to claim 1, wherein
the two-dimensional lattice is a square lattice, and
second modified refractive index regions having a refractive index different from the refractive index of the base member is further disposed at second lattice points which are lattice points of a square lattice having a same period length a as a period length of the two-dimensional lattice and shifted from the two-dimensional lattice, or at positions shifted from the second lattice points by different shift amounts each.

6. The two-dimensional photonic crystal laser according to claim 5, wherein the second lattice points are disposed at a position shifted from the lattice points of the two-dimensional lattice by a distance larger than 0.25 a and smaller than 0.75 a in a same direction as one of basic translation vectors of the two-dimensional lattice.

7. The two-dimensional photonic crystal laser according to claim 1, wherein
the two-dimensional lattice is a square lattice, and
each of the plurality of modified refractive index regions is disposed at a corresponding one of the lattice points of the two-dimensional lattice so as to be shifted from the lattice point in one predetermined direction or a direction different from the one direction by 180°, the one direction being a direction parallel to the two-dimensional photonic crystal layer and inclined from both two directions in which the lattice points are disposed with the period length.

8. The two-dimensional photonic crystal laser according to claim 1, wherein the modulation phase Ψ(r↑) of each of the plurality of modified refractive index regions is modulated so as to periodically change with a predetermined modulation period in a direction parallel to the two-dimensional photonic crystal layer, and the modulation period continuously increases or decreases.

9. The two-dimensional photonic crystal laser according to claim 1, wherein the modulation phase $\Psi(r\uparrow)$ of each of the plurality of modified refractive index regions is adjusted from a basic modulation state, in which the modulation phase $\Psi(r\uparrow)$ is modulated so as to periodically change with a predetermined modulation period in a direction parallel to the two-dimensional photonic crystal layer and the modulation period continuously increases or decreases, such that a radiated electric field distribution indicating a distribution of an electric field radiated from the two-dimensional photonic crystal layer becomes closer to a target radiated electric field distribution obtained by performing an inverse Fourier transform on a predetermined target far electric field distribution to be formed at a position separated from the two-dimensional photonic crystal layer than the radiated electric field distribution in the basic modulation state.

10. A two-dimensional photonic crystal laser array comprising:

a plurality of the two-dimensional photonic crystal lasers according to claim 1 having the modulations different from each other; and an electric current supply part configured to simultaneously supply an electric current to the pairs of electrodes individually provided in the plurality of two-dimensional photonic crystal lasers.

11. The two-dimensional photonic crystal laser array according to claim 10, wherein the electric current supply part includes a mesh electrode in which a plurality of holes are formed in a plate member having conductivity, the two-dimensional photonic crystal laser is disposed in each of the plurality of holes, and in each of the plurality of holes, the plate member around the hole is connected to one of the pair of electrodes, or is one of the pair of electrodes.

12. A two-dimensional photonic crystal laser array comprising:

a) a pair of electrode groups including electrode groups of which at least one group includes a plurality of partial electrodes;

b) an active layer provided between the pair of electrode groups and, upon being supplied with an electric current from one of the plurality of partial electrodes, configured to generate light including a predetermined wavelength 2 at a position corresponding to the partial electrode from which the electric current is supplied; and c) a two-dimensional photonic crystal layer provided between any one of the pair of electrode groups and the active layer and including a plate-shaped base member and a plurality of modified refractive index regions disposed in the base member and having a refractive index different from a refractive index of the base member, wherein at a corresponding one of lattice points of a square lattice in which the lattice points are periodically disposed with a lattice point period corresponding to the predetermined wavelength 2L, each of the plurality of modified refractive index regions is disposed to be shifted from the lattice point in one predetermined direction or a direction different from the one direction by 180°, the one direction being a direction parallel to the two-dimensional photonic crystal layer and inclined from both two directions in which the lattice points are disposed with the lattice point period, and in a direction parallel to the two-dimensional photonic crystal layer, a distance from the lattice point or/and an area of a planar shape of each of the plurality of modified refractive index regions is/are modified with a composite modulation period in which a plurality of periods different from each other are superposed on each other, and is/are expressed by a modulation phase $\Psi(r\uparrow)$ expressed using a vector $r\uparrow$ indicating a position of each of the lattice points of the two-dimensional lattice, a vector $k_n\uparrow$ indicating a combination of an inclination angle and an azimuthal angle of each of n (n is an integer of 2 or more) laser beams differing in the inclination angle and/or the azimuthal angle from each other, and an amplitude $A_n$ and a phase $\exp(i\alpha_n)$ determined for each n as

[Expression 1]

$$\Psi(r\uparrow) = \arg\left[\int\int\sum_n A_n \exp(i\alpha_n)\delta(k\uparrow - k_n\uparrow)\exp(ik\uparrow\cdot r\uparrow)dk\uparrow\right] \quad (1)$$

and the amplitude $A_n$ and/or the phase $\exp(i\alpha_n)$ for each value of n differ(s) from each other in at least two different values of n.

* * * * *